United States Patent [19]

Shirai et al.

[11] Patent Number: 5,582,947
[45] Date of Patent: Dec. 10, 1996

[54] GLOW DISCHARGE PROCESS FOR MAKING PHOTOCONDUCTIVE MEMBER

[75] Inventors: Shigeru Shirai, Yamato; Junichiro Kanbe; Tadaji Fukuda, both of Yokohama, all of Japan

[73] Assignee: Canon Kabushiki Kaisha, Tokyo, Japan

[21] Appl. No.: 469,690

[22] Filed: Jun. 6, 1995

Related U.S. Application Data

[62] Division of Ser. No. 396,064, Feb. 28, 1995, abandoned, which is a continuation of Ser. No. 98,069, Jul. 28, 1993, abandoned, which is a continuation of Ser. No. 900,947, Jun. 17, 1992, Pat. No. 5,258,250, which is a division of Ser. No. 735,758, Jul. 29, 1991, Pat. No. 5,141,836, which is a continuation of Ser. No. 535,983, Jun. 8, 1990, abandoned, which is a continuation of Ser. No. 445,161, Dec. 6, 1989, abandoned, which is a continuation of Ser. No. 244,543, Sep. 12, 1988, abandoned, which is a continuation of Ser. No. 110,043, Oct. 14, 1987, abandoned, which is a division of Ser. No. 27,051, Mar. 23, 1987, abandoned, which is a continuation of Ser. No. 872,611, Jun. 10, 1986, abandoned, which is a continuation of Ser. No. 705,515, Feb. 26, 1985, Pat. No. 4,609,601, which is a continuation of Ser. No. 335,464, Dec. 29, 1981, Pat. No. 4,539,283.

[30] Foreign Application Priority Data

| Jan. 16, 1981 | [JP] | Japan | 56-5524 |
| Jan. 16, 1981 | [JP] | Japan | 56-5525 |
| Jan. 16, 1981 | [JP] | Japan | 56-5526 |

[51] Int. Cl.$^6$ ..................... G03G 5/082
[52] U.S. Cl. ..................... 430/128; 430/133
[58] Field of Search ..................... 430/128, 133

[56] References Cited

U.S. PATENT DOCUMENTS

| 4,217,374 | 8/1980 | Ovshinsky et al. | 430/84 X |
| 4,226,898 | 10/1980 | Ovshinsky et al. | 430/84 X |
| 4,251,289 | 2/1981 | Moustakas et al. | 204/192.1 |
| 4,253,882 | 2/1981 | Dalal | 427/74 X |
| 4,265,991 | 5/1981 | Hirai et al. | 430/65 X |
| 4,289,822 | 9/1981 | Shimada et al. | 427/74 X |
| 4,777,103 | 10/1988 | Nor et al. | 430/128 |
| 5,122,431 | 6/1992 | Kodama et al. | 430/128 |
| 5,141,836 | 8/1992 | Shirai et al. | 430/128 |

Primary Examiner—Roland Martin
Attorney, Agent, or Firm—Fitzpatrick, Cella, Harper & Scinto

[57] ABSTRACT

A photoconductive member, comprises a support for a photoconductive member and an amorphous layer which is constituted of silicon atoms as matrix containing at least one of hydrogen atom and halogen atom and exhibits photoconductivity, said amorphous layer having a layer region containing carbon atoms in at least a part thereof, the content of the carbon atoms in said layer region being distributed unevenly in the direction of the thickness of said layer.

38 Claims, 3 Drawing Sheets

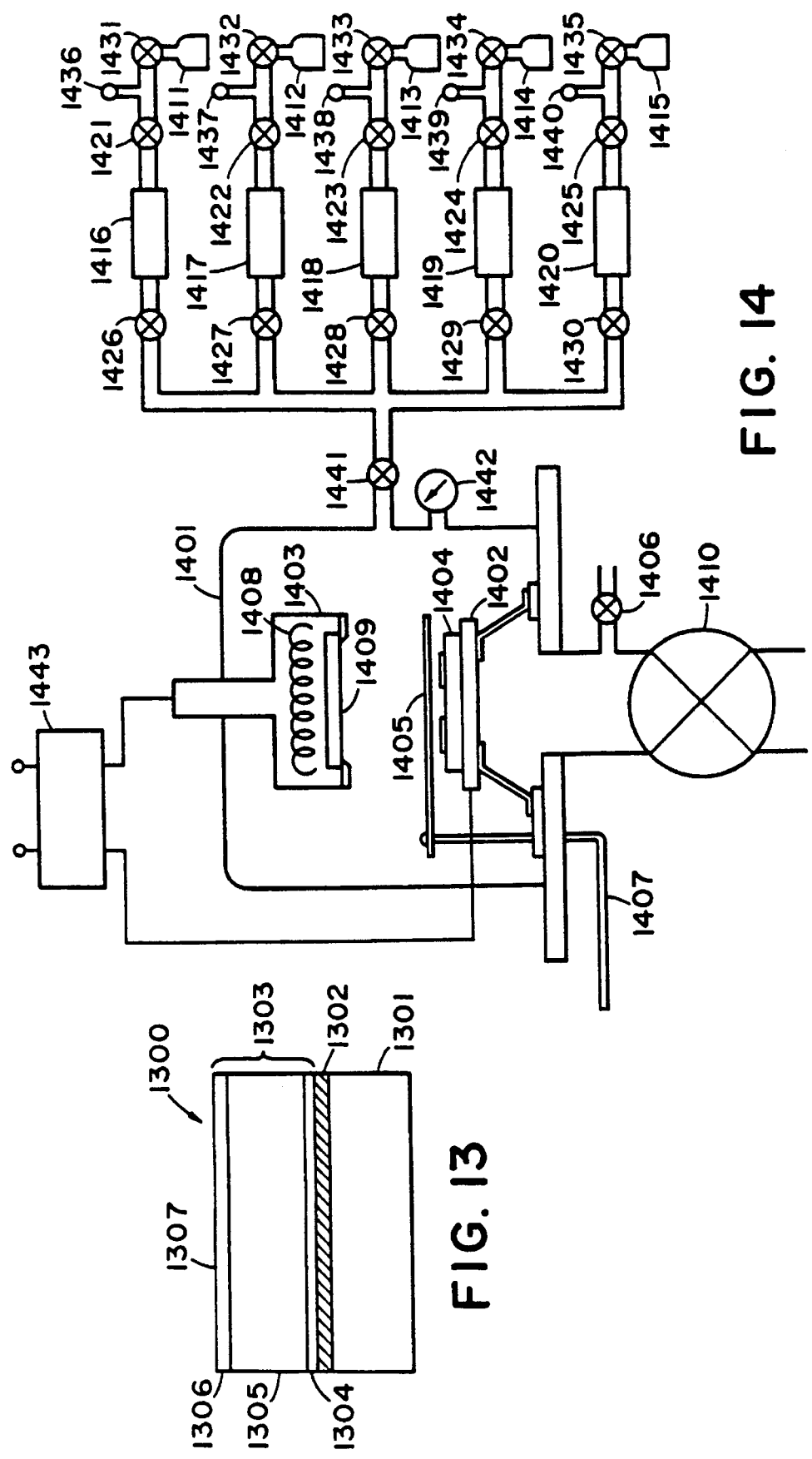

GLOW DISCHARGE PROCESS FOR MAKING PHOTOCONDUCTIVE MEMBER

This application is a division of application Ser. No. 08/396,064, filed Feb. 28, 1995, now abandoned, which in turn is a continuation of application Ser. No. 08/098,069, filed Jul. 28, 1993, now abandoned; which is a continuation of application Ser. No. 07/900,947, filed Jun. 17, 1992, now U.S. Pat. No. 5,258,250; which in turn, is a division of application Ser. No. 07/735,758 filed Jul. 29, 1991, now U.S. Pat. No. 5,141,836; which is a continuation of application Ser. No. 07/535,983, filed Jun. 8, 1990, now abandoned, which in turn, is a continuation of application Ser. No. 445,161, filed Dec. 6, 1989, now abandoned, which in turn, is a continuation of application Ser. No. 244,543, filed Sep. 12, 1988, now abandoned, which in turn, is a continuation of application Ser. No. 110,043, filed Oct. 14, 1987, now abandoned, which in turn, is division of application Ser. No. 027,051, filed Mar. 23, 1987, now abandoned, which in turn, is a continuation of application Ser. No. 872,611, filed Jun. 10, 1986, now abandoned, which in turn, is a continuation of application Ser. No. 705,515, filed Feb. 26, 1985, now U.S. Pat. No. 4,609,601, which is a continuation of application Ser. No. 335,464, filed Dec. 29, 1981, now U.S. Pat. No. 4,539,283.

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays and gamma-rays).

2. Description of the Prior Art

Photoconductive materials, which constitute image forming members for electrophotography in solid state image pick-up devices or in the field of image formation, or photoconductive layers in manuscript reading devices, are required to have a high sensitivity, a high SN ratio [photocurrent ($I_p$)/Dark current ($I_d$)], spectral characteristics corresponding to those of electromagnetic waves to be irradiated, a good response to light, a desired dark resistance value as well as no harm to human bodies during usage. Further, in a solid state image pick-up device, it is also required that the residual image should easily be treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as a-Si) has recently attracts attention as a photoconductive material. For example, German Laid-Open Patent Publication Nos. 2746967 and 2855718 disclose applications of a-Si for use in image forming members for electrophotography, and U.K. Laid-Open Patent Publication No. 2029642 an application of a-Si for use in a photoconverting reading device. However, the photoconductive members having photoconductive layers constituted of a-Si or prior art have various electrical, optical and photoconductive characteristics such as dark resistance value, photosensitivity and response to light as well as environmental characteristics in use such as weathering resistance and humidity resistance, which should further be improved. Thus, in a practical solid state image pick-up device, reading device or an image forming member for electrophotography, they cannot effectively be used also in view of their productivity and possibility of their mass production.

For instance, when applied in an image forming member or a photographic device, residual potential is frequently observed to remain during use thereof. When such a photoconductive member is repeatedly used for a long time, there will be caused various inconveniences such as accumulation of fatigue by repeated uses or so-called ghost phenomenon wherein residual images are formed.

Further, according to the experience by the present inventors from a number of experiments, a-Si material constituting the photoconductive layer of an image forming member for electrophotography, while it has a number of advantages, as compared with Se, CdS, ZnO or organic photoconductive materials such as PVCz or TNF of prior art, is also found to have several problems to be solved. Namely., when charging treatment is applied for formation of electrostatic images on the photoconductive layer of an image forming member for electrophotography having a photoconductive member constituted of a mono-layer of a-Si which has been endowed with characteristics for use in a solar battery of prior art, dark decay is markedly rapid, whereby it is difficult to apply a conventional photographic method. This tendency is further pronounced under a humid atmosphere to such an extent in some cases that no charge is retained at all before development.

Thus, it is required in designing of a photoconductive material to make efforts to obtain desirable electrical, optical and photoconductive characteristics along with the improvement of a-Si materials per se and to make a photoconductive member capable of obtaining stable image/quality.

In view of the above points, the present invention contemplates the achievement obtained as a result of extensive studies made comprehensively from the standpoints of applicability and utility of a-Si as a photoconductive member for image forming members for electrophotography, solid state image pick-up devices or reading devices. It has now been found that a photoconductive member elaborated to have a layer structure comprising an amorphous layer exhibiting photoconductivity, which is constituted of so-called hydrogenated amorphous silicon, halogenated amorphous silicon or halogen-containing hydrogenated amorphous silicon which is an amorphous material containing at least one of hydrogen atom(H) and halogen atom(X) in a matrix of silicon [hereinafter referred to comprehensively as a-Si(H, X)], and prepared to have a specific composition as described hereinafter, is not only usually useful but also has characteristics-superior in substantially all respects to those of the photoconductive members of prior art, especially markedly excellent characteristics as a photoconductive member for electrophotography with respect to photosensitivity and stabilization of image quality. The present invention is based on such finding.

SUMMARY OF THE INVENTION

The primary object of the present invention is to provide a photoconductive member having constantly stable electrical, optical and photoconductive characteristics, which is an all-environment type substantially without limitations with respect to the environment under which it is used, being markedly excellent in light-resistant fatigue without deterioration after repeated uses and free entirely or substantially from residual potentials observed.

Another object of the present invention is to provide a photoconductive member, having a high photosensitivity with a spectral sensitive region covering substantially all over the region of visible light, and having also a rapid response to light.

Still another object of the present invention is to provide a photoconductive member, which is sufficiently capable of bearing charges at the time of charging treatment of formation of electrostatic charges to the extent such that a conventional electrophotographic method can be applied when it is provided for use as an image forming member for electrophotography, and which has excellent electrophotographic characteristics of which substantially no deterioration is observed even under a highly humid atmosphere.

Further, still another object of the present invention is to provide a photoconductive member for electrophotography capable of providing easily a high quality image which is high in density, clear in halftone and high in definition.

According to the present invention, there is provided a photoconductive member, comprising a support for a photoconductive member and an amorphous layer [a-Si(H, X)] which is constituted of silicon atoms as matrix containing at least one of hydrogen atom(H) and halogen atom(X) and exhibits photoconductivity, said amorphous layer having a layer region containing carbon atoms in at least a part thereof, the content of the carbon atoms in said layer region being distributed unevenly in the direction of the thickness of said layer.

BRIEF DESCRIPTION OF THE DRAWINGS

In the Drawings:

FIG. 13 is a schematic sectional view of the layer structure of another preferred embodiment of the photoconductive member according to the present invention; and FIG. 14 is a schematic flow chart for illustration of one example of device for preparation of the photoconductive member according to the present invention.

DESCRIPTION OF THE PREFERRED EMBODIMENTS

Figure 1:
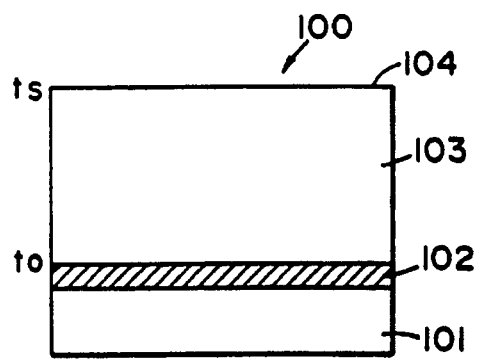
FIG. 1 shows a schematic sectional view of a preferred embodiment of the photoconductive member according to the present invention.

Referring now to the Drawings, the photoconductive members according to the present invention are to be described in detail below.

FIG. 1 shows a schematic sectional view for illustration of a typical exemplary constitution of the photoconductive member of this invention.

The photoconductive member 100 as shown in FIG. 1 comprises a support 101 for photoconductive member, a barrier layer 102, which may optionally be provided on said support as an intermediate layer, and an amorphous layer 103 exhibiting photoconductivity, said amorphous layer having a layer region containing carbon atoms in at least a part thereof, the content of carbon atoms in said layer region being distributed unevenly in the direction of thickness of the layer.

The photoconductive member designed to have the layer structure as described above has overcome all of the problems as mentioned above and exhibits excellent electrical, optical and photoconductive characteristics as well as good adaptability for environments during usage.

In particular, when it is applied as an image forming member for electrophotography, it has good charge bearing capacity during charging treatment without influence of residual potential on the image formation, and its electrical properties are stable even in a high humid atmosphere. Moreover, it is highly sensitive and has a high SN ratio as well as good performance of repeated uses, thus being capable of giving constantly visible images of high quality with high density, clear halftone and high resolution.

The support 101 may be either electroconductive or insulating. As the electroconductive material, there may be mentioned metals such as NiCr, stainless steel, Al, Cr, Mo, Au, Nb, Ta, V, Ti, Pt, Pd, etc. or alloys thereof.

As insulating supports, there may conventionally be used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and the like. These insulating supports may suitably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$) thereof. Alternatively, a synthetic resin film such as polyester film can be subjected to the electroconductive treatment on its surface by vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metals. The support 101 may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in Continuous high speed copying. The support 101 may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally 10 μ or more from the points of fabrication and handling of the support as well as its mechanical strength.

The barrier layer 102 has the function of barring effectively injection of free carriers into the side of the amorphous layer 103 from the side of the support 101 and permitting easily the photocarriers generated by irradiation of electromagnetic waves in the amorphous layer 103 and migrating the support 101 to pass therethrough from the side of the amorphous layer 103 to the side of the support 101.

While the barrier layer 102 can be provided to give the function as described above, it is not absolutely required in the present invention to provide such a barrier layer 102 only if the function similar to that of the barrier layer 102 can be exhibited sufficiently at the interface between the support 101 and the amorphous layer 103 when the amorphous layer 103 is provided directly on the support 101.

The barrier layer 102, which is formed so as to have the function as described above exhibited to its full extent, may also desirably be formed so as to provide mechanical and electrical contact and adhesion between the support 101 and the amorphous layer 103. As the material constituting the barrier layer 102, most materials can be adopted so long as they can give the various characteristics as mentioned above as desired.

Among such materials, those specifically mentioned as effective materials for the present invention may include amorphous materials containing at least one kind of atom selected from the group consisting of carbon(C), nitrogen(N) and oxygen(O), optionally together with at least one of hydrogen atom and halogen atom, in a matrix of silicon atoms [these are referred to comprehensively as a-$[Si_x(C,N)_{1-x}]_y$ $(H, X)_{1-y}$(where $0<x<1$, $0<y<1$)]; electrically insulating metal oxides, electrically insulating organic compounds; or the like.

In the present invention, in case of the materials containing halogen atoms(X) among those constituting the above-mentioned barrier layer 102, the halogen atom may preferably be F, Cl, Br or I, especially F or Cl.

Typical examples of the amorphous materials as mentioned above effectively used for constituting the barrier layer 102 may include, for example, carbon type amorphous materials such as a-$Si_aC_{1-a}$, a-$(Si_bC_{1-b})_cH_{1-c}$, a-$(Si_dC_{1-d})_eX_{1-e}$, a-$(Si_fC_{1-f})_g(H+X)_{1-g}$; nitrogen type amorphous materials such as a-$Si_hN_{1-h}$, a-$(Si_iN_{1-i})_jH_{1-j}$, a-$(Si_kN_{1-k})_lX_{1-l}$, a-$(Si_mN_{1-m})_n$ $(H+X)_{1-n}$; oxygen type amorphous materials such as a-$Si_oO_{1-o}$, a-$(Si_pO_{1-p})_qH_{1-q}$, a-$(Si_rO_{1-r})_sX_{1-s}$, a-$(Si_tO_{1-t})_u$ $(H+X)_{1-u}$; etc. Further, there may also be mentioned amorphous materials containing at least two or more kinds of atoms of C, N and O as constituent atoms in the amorphous materials as set forth above (where $0<a$, b, c, d, e, f, g, h, i, j, k, l, m, n, o, p, q, r, s, t, $u<1$).

These amorphous materials may suitably be selected depending on the properties required for the barrier 102 by optimum design of the layer structure and easiness in consecutive fabrication of the amorphous layer 103 to be superposed on said barrier layer 102. In particular, from standpoint of properties, nitrogen type and oxygen type amorphous materials, especially oxygen type amorphous materials may preferably be selected.

The barrier layer 102 constituted of an amorphous material as mentioned above may be formed by the glow discharge method, the sputtering method, the ion implantation method, the ion plating method, the electron-beam method or the like.

When the barrier layer 102 is formed according to the glow discharge method, the starting gases for formation of the aforesaid amorphous material, which may be admixed, if necessary, with a diluting gas at a desired mixing ratio, are introduced into the chamber for vacuum, deposition, and the gas introduced is converted to a gas plasma by excitation of glow discharge in said gas thereby to deposit the substance for forming the aforesaid amorphous material on the support 101.

In the present invention, the substances effectively used as the starting materials for formation of the barrier layer 102 constituted of carbon type amorphous materials may include silicon hydride gases constituted of Si and H atoms such as silanes, as exemplified by $SiH_4$, $Si_2H_6$, $Si_3H_8$, $Si_4H_{10}$, etc., hydrocarbons constituted of C and H atoms such as saturated hydrocarbons having 1 to 5 carbon atoms, ethylenic hydrocarbons having 2 to 5 carbon atoms or acetylenic hydrocarbons having 2 to 4 carbon atoms. More specifically, typical examples are saturated hydrocarbons such as methane($CH_4$), ethane ($C_2H_6$), propane ($C_3H_8$), n-butane(n-$C_4H_{10}$), pentane($C_5H_{12}$), and the like; ethylenic hydrocarbons such as ethylene($C_2H_4$), propylene ($C_3H_6$), butene-1 ($C_4H_8$), butene-2 ($C_4H_8$), isobutylene ($C_4H_8$), pentene($C_5H_{10}$), and the like; and acetylenic hydrocarbons such as acetylene ($C_2H_2$), methylacetylene ($C_3H_4$), butyne ($C_4H_6$), and the like Typical examples of the starting gas constituted of Si, C and H are alkyl silanes such as Si $(CH_3)_4$, Si $(C_2H_5)_4$ and the like. In addition to these starting gases, $H_2$ can of course be effectively used as the starting gas for introduction of hydrogen atoms(H).

Among the starting gas for formation of the barrier layer 102 constituted of carbon type amorphous materials containing halogen atoms, the starting materials for supplying halogen atoms may include single substances of halogen, hydrogen halides, interhalogen compounds, silicon halides, halogen-substituted silicon hydrides, etc. More specifically, there may be included single substances of halogen such as halogenic gases of fluorine, chlorine, bromine and iodine; hydrogen halides such as HF, HI, HCl, HBr, etc.; interhalogen compounds such as BrF, ClF, $ClF_3$, $ClF_5$, $BrF_5$, $BrF_3$, $IF_7$, $IF_5$, ICl, IBr, etc.; silicon halides such as $SiF_4$, $Si_2F_6$, $SiCl_4$, $SiCl_3Br$, $SiCl_2Br_2$, $SiClBr_3$, $SiCl_3I$, $SiBr_4$, etc.; halogen-substituted silicon hydrides such as $SiH_2F_2$, $SiH_2Cl_2$, $SiHCl_3$, $SiH_3Cl$, $SiH_3Br$, $SiH_2Br_2$, $SiHBr_3$.

In addition to those mentioned above, there are halogen-substituted paraffinic hydrocarbons such as $CCl_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; alkyl silanes such as $Si(CH_3)_4$, $Si(C_2H_5)_4$, etc.; and halogen-containing alkyl silanes such as $SiCl(CH_3)_3$, $SiCl_2(CH_3)_2$, $SiCl_3CH_3$, etc.

These substances for forming barrier layer may be selected and used as desired in formation of the barrier layer so that silicon atoms, carbon atoms and, if necessary, halogen atoms and hydrogen atoms may be incorporated at a desirable composition ratio in the barrier layer formed.

For example, it is possible to form a barrier constituted of a-$(Si_fC_{1-f})_g(X+H)_{1-g}$ by introducing $Si(CH_3)_4$, which can incorporate silicon atoms, carbon atoms and hydrogen atoms easily and can form a barrier layer of desired properties together with a compound for incorporation of halogen atoms such as $SiHCl_3$, $SiCl_4$, $SiH_2Cl_2$, $SiH_3Cl$, or the like at a suitable mixing ratio in a gaseous state into a device system for formation of the barrier layer, followed by excitation of glow discharge therein.

When the glow discharge method is adopted for constitution of the barrier layer 102 with a nitrogen type amorphous material, a desired material may be selected from those mentioned above for formation of the barrier layer and the starting material for supplying nitrogen atoms may be used in addition thereto. Namely, as the starting materials which can effectively be used as starting gases for supplying nitrogen atoms in forming the barrier layer 102, there may be mentioned compounds constituted of N or N and H including gaseous or gasifiable nitrogen, nitrides and azides, as exemplified by nitrogen($N_2$), ammonia($NH_3$), hydrazine($H_2NNH_2$), hydrogen azide ($HN_3$), ammonium azide($NH_4N_3$), and so on. In addition it is also possible to use a nitrogen halide compound which can incorporate both nitrogen atoms and halogen atoms, such as nitrogen trifluoride($F_3N$), nitrogen tetrafluoride($F_4N_2$), and the like.

When the glow discharge method is adopted for constituting the barrier layer 102 with an oxygen type amorphous material, a desirable substance is selected from those for formation of the barrier layer as mentioned above and a starting material which can be a starting gas for supplying oxygen atoms may be used in combination. That is, as the starting materials which can be effectively used as starting gases for supplying oxygen atoms in formation of the barrier layer 102, there may be mentioned oxygen($O_2$), ozone($O_3$), disiloxane($H_3SiOSiH_3$), trisiloxane($H_3SiOSiH_2OSiH_3$), etc.

Other than these starting materials for formation of the barrier layer, there may also be mentioned, for example, carbon monoxide (CO), carbon dioxide ($CO_2$), dinitrogen oxide ($N_2O$) nitrogen monoxide (NO), dinitrogen trioxide ($N_2O_3$), nitrogen dioxide($NO_2$), dinitrogen tetraoxide($N_2O_4$), dinitrogen pentoxide ($N_2O_5$), nitrogen trioxide($NO_3$), and the like.

As described above, when forming a barrier layer 102 according to the glow discharge method, the starting materials for formation of the barrier layer are suitably selected from those mentioned above so that the barrier layer having the desired characteristic, which is constituted of desired materials, can be formed. For example, when using the glow discharge method, there may be employed a single gas such as $Si(CH_3)_4$, $SiCl_2(CH_3)_2$ and the like, or a gas mixture such as $SiH_4$-$N_2O$ system, $SiH_4$-$O_2$(-Ar) system, $SiH_4$-$NO_2$ system, $SiH_4$-$O_2$-$N_2$ system, $SiCl_4$-NO-$H_2$ system, $SiH_4$-$NH_3$ system, $SiCl_4$-$NH_4$ system, $SiH_4$-$N_2$ system, $SiH_4$-$NH_3$-No system, $Si(CH_3)_4$-$SiH_4$ system, $SiCl_2(CH_3)_2$-$SiH_4$ system, etc. as the starting material for formation of the barrier layer 102.

Alternatively, the barrier layer 102 can be formed according to the sputtering method by using a single crystalline or polycrystalline Si wafer, C wafer or a wafer containing Si and C mixed therein as target, and effecting sputtering of these in various atmospheres. For example, when Si wafer is used as target, the starting gas for introduction of carbon atoms(C) and hydrogen atoms(H) or halogen atoms(X) which may optionally be diluted with a diluting gas, if desired, are introduced into the deposition chamber for sputter to form a gas plasma of these gases and effect sputtering of the aforesaid Si wafer. As other methods, by use of separate targets of Si and C, or one sheet of a mixture of Si and C, sputtering can be effected in a gas atmosphere containing at least hydrogen atoms (H) or halogen atoms (X).

As the starting gases for incorporation of carbon atoms, hydrogen atoms or halogen atoms in the barrier layer formed, the aforesaid starting gases as shown in the glow discharge method may also be useful in the sputtering method.

For formation of a barrier layer 102 constituted of a nitrogen type amorphous material according to the sputtering method, a single crystalline or polycrystalline Si wafer or $Si_3N_4$ wafer or a wafer containing Si and $Si_3N_4$ mixed therein may be used as target and sputtering may be effected in various gas atmospheres.

For example, when Si wafer is used as target, a starting gas for introduction of nitrogen atoms optionally together with a starting gas for incorporation of hydrogen atoms and/or halogen atoms, for example $H_2$ and $N_2$ or $NH_3$, which may be diluted with a diluting gas if desired, is introduced into a deposition chamber for sputter, in which gas plasma of these gases is formed and the aforesaid Si wafer is subjected to sputtering.

Alternatively, with the use of Si and $Si_3N_4$ as separate targets or with the use of a target of one sheet of a mixture of Si and $Si_3N_4$, sputtering may be effected in a diluted gas atmosphere as a gas for sputter or in a gas atmosphere containing at least one of H atoms and X atoms.

As the starting gas for introduction of nitrogen atoms (N), there may be employed those for introduction of nitrogen atoms(N) among the starting materials, as shown in examples for formation of the barrier layer by the glow discharge method, as effective gases also in case of sputtering.

For formation of a barrier layer 102 constituted of an oxygen type amorphous material according to the sputtering method, a single crystalline or polycrystalline Si wafer or $SiO_2$ wafer or a wafer containing Si and $SiO_2$ mixed therein may be used as target and sputtering may be effected in various gas atmospheres.

For example, when Si wafer is used as target, a starting gas for introduction of oxygen atoms optionally together with a starting gas for incorporation of hydrogen atoms and/or halogen atoms, for example, $SiH_4$ and $O_2$, or $O_2$, which may be diluted with a diluting gas if desired, is introduced into a deposition chamber for sputter, in which gas plasma of these gases is formed and the aforesaid Si wafer is subjected to sputtering.

Alternatively, with the use of Si and $SiO_2$ as separate targets or with the use of a target of one sheet of a mixture of Si and $SiO_2$, sputtering may be effected in a diluted gas atmosphere as a gas for sputter or in a gas atmosphere containing at least one of H atoms and X atoms.

As the starting gas for introduction of oxygen atoms(O), there may be employed those for introduction of oxygen atoms(O) among the starting materials, as shown in examples for formation of the barrier layer by the glow discharge method, as effective gases also in case of sputtering.

As the diluting gas to be employed in forming the barrier layer 102 according to the glow discharge method or the sputtering method, there may be included so called rare gases such as He, Ne, Ar, and the like as suitable ones.

When the barrier layer 102 is constituted of the amorphous material as described above, it is formed carefully so that the characteristics required may be given exactly as described.

That is, a substance constituted of Si and at least one of C, N and O, and optionally H and/or X can take various forms from crystalline to amorphous and electrical properties from conductive through semi-conductive to insulating and from photoconductive to non-photoconductive depending on the preparation conditions. In the present invention, the preparation conditions are strictly related so that there may be formed non-photoconductive amorphous materials at least with respect to the light in so-called visible region.

Since the function of the amorphous barrier layer 102 is to bar injection of free carriers from the side of the support 101 into the amorphous layer 103, while permitting easily the photocarriers generated in the amorphous layer 103 to be migrated and passed therethrough to the side of the support 101, it is desirable that the above-mentioned amorphous materials are formed to exhibit electrically insulating behaviours at least in the visible light region.

The barrier layer 102 is formed also to have a mobility value with respect to passing carriers to the extent that photocarriers generated in the amorphous layer 103 can pass easily through the barrier layer 102.

As another critical element in the conditions for preparation of the barrier layer 102 from the amorphous material having the characteristics as described above, there may be mentioned the support temperature during preparation thereof.

In other words, in forming a barrier layer 102 constituted of the aforesaid amorphous material on the surface of the support 101, the support temperature during the layer formation is an important factor affecting the structure and characteristics of the layer formed. In the present invention, the support temperature during the layer formation is strictly controlled so that the aforesaid amorphous material having the intended characteristics may be prepared exactly as desired.

The support temperature during formation of the barrier layer 102, which is selected conveniently within an optimum range depending on the method employed for formation of the barrier layer 102, is generally from 20° to 300° C., preferably 50° to 250° C. For formation of the barrier layer 102, it is advantageous to adopt the glow discharge method or the sputtering method, since these methods can afford strict controlling of the atomic ratios constituting each layer or layer thickness with relative ease as compared with other methods, when forming consecutively the amorphous layer 103 on the barrier layer 102 in the same system, and further a third layer formed on the amorphous layer 102, if desired. In case of forming the barrier layer 102 according to these layer forming methods, the discharging power and the gas pressure during layer formation may also be mentioned similarly to the support temperature as described above, as important factors influencing the characteristics of the barrier layer to be prepared.

The discharging power conditions, for preparing the barrier layer 102 having the characteristics to achieve the intended purpose effectively with good productivity, is generally 1 to 300 W, preferably 2 to 150 W. The gas pressure in the deposition chamber is generally $3 \times 10^{-3}$ to 5 Torr, preferably $8 \times 10^{-3}$ to 0.5 Torr.

The contents of carbon atoms, nitrogen atoms, oxygen atoms, hydrogen atoms and halogen atoms in the barrier layer 102 are important factors, similarly to the conditions for preparation of the barrier layer 102, for forming the barrier layer provided with desired characteristics.

In forming the barrier layer 102 constituted of a-$Si_aC_{1-a}$, the content of carbon atoms based on silicon atoms may generally be 60 to 90 atomic %, preferably 65 to 80 atomic %, most preferably 70 to 75 atomic %, namely in terms of representation by the index a, 0.1 to 0.4, preferably 0.2 to 0.35, most preferably 0.25 to 0.3. In case of the constitution of a-$(Si_bC_{1-b})_cH_{1-c}$, the content of carbon atoms is generally 30 to 90 atomic %, preferably 40 to 90 atomic %, most preferably 50 to 80 atomic %, and the content of hydrogen atoms is generally 1 to 40 atomic %, preferably 2 to 35 atomic %, most preferably 5 to 30 atomic %, namely in terms of representations by the indexes b and c, b being generally 0.1 to 0.5, preferably 0.1 to 0.35, most preferably 0.15 to 0.3, and c being generally 0.60 to 0.99, preferably 0.65 to 0.98, most preferably 0.7 to 0.95. In case of the constitution of a-$(Si_dC_{1-d})_eX_{1-e}$ or a-$(Si_fC_{1-f})_g(H+X)_{1-g}$, the content of carbon atoms is generally 40 to 90 atomic %, preferably 50 to 90 atomic %, most preferably 60 to 80 atomic %, the content of halogen atoms or the sum of the contents of halogen atoms and hydrogen atoms generally 1 to 20 atomic %, preferably 1 to 18 atomic %, most preferably 2 to 15 atomic %, and the content of hydrogen atoms, when both halogen atoms and hydrogen atoms are contained, is generally 19 atomic % or less, preferably 13 atomic % or less, namely in terms of representation by d, e, f and g, d and f are generally 0.1 to 0.47, preferably 0.1 to 0.35, most preferably 0.15 to 0.3, and e and g 0.8 to 0.99, preferably 0.85 to 0.99, most preferably 0.85 to 0.98.

When the barrier layer 102 is constituted of a nitrogen type amorphous material, the content of nitrogen atoms based on silicon atoms in case of a-$Si_hN_{1-h}$ is generally 43 to 60 atomic %, preferably 43 to 50 atomic %, namely in terms of representation by h, generally 0.43 to 0.60, preferably 0.43 to 0.50.

In case of the constitution of a-$(Si_iN_{1-i})_jH_{1-j}$, the content of nitrogen atoms is generally 25 to 50 atomic %, preferably 35 to 55 atomic %, and the content of hydrogen atoms generally 2 to 35 atomic %, preferably 5 to 30 atomic %, namely in terms of representation by i and j, i being generally 0.43 to 0.6, preferably 0.43 to 0.5 and j generally 0.65 to 0.98, preferably 0.7 to 0.95. In case of the constitution of a-$(Si_kN_{1-k})_lX_{1-l}$ or a-$(Si_mN_{1-m})_n(H+X)_{1-n}$, the content of nitrogen atoms is generally 30 to 60 atomic %, preferably 40 to 60 atomic %, the content of halogen atoms or the sum of contents of halogen atoms and hydrogen atoms generally 1 to 20 atomic %, preferably 2 to 15 atomic %, and the content of hydrogen atoms, when both halogen atoms and hydrogen atoms are contained, generally 19 atomic % or less, preferably 13 atomic % or less, namely in terms of representation by k, l, m and n, k and m being generally 0.43 to 0.60, preferably 0.43 to 0.49, and l and n generally 0.8 to 0.99, preferably 0.85 to 0.98.

When the barrier layer 102 is constituted of an oxygen type amorphous material, the content of oxygen atoms in the barrier layer 102 constituted of a-$Si_oO_{1-o}$ based on silicon atoms is generally 60 to 67 atomic %, preferably 63 to 67 atomic %, namely in terms of representation by o generally 0.33 to 0.40, preferably 0.33 to 0.37. In case of the constitution of a-$(Si_pO_{1-p})_qH_{1-q}$, the content of oxygen atoms in the barrier layer 102 is generally 39 to 66 atomic %, preferably 42 to 64 atomic %, and the content of hydrogen atoms generally 2 to 35 atomic %, preferably 5 to 30 atomic %, namely in terms of representation by p and q, p being generally 0.33 to 0.40, preferably 0.33 to 0.37 and q generally 0.65 to 0.98, preferably 0.70 to 0.95. When the barrier layer 102 is constituted of a-$(Si_rO_{1-r})_sX_{1-s}$ or a-$(Si_tO_{1-t})_u(H+X)_{1-u}$, the content of oxygen atoms in the barrier layer 102 is generally 48 to 66 atomic %, preferably 51 to 66 atomic %, the content of halogen atoms or the sum of contents of halogen atoms and hydrogen atoms, when hydrogen atoms further are contained, generally 1 to 20 atomic %, preferably 2 to 15 atomic %, with the content of hydrogen atoms, when both halogen atoms and hydrogen atoms are contained, being 19 atomic % or less, preferably 13 atomic % or less. As represented in terms of r, s, t and u, r or t is generally 0.33 to 0.40, preferably 0.33 to 0.37, and s or u generally 0.80 to 0.99, preferably 0.85 to 0.98.

As the electically insulating metal oxides for constituting the barrier layer 102, there may preferably be mentioned $Al_2O_3$, BeO, CaO, $Cr_2O_3$, $P_2O_5$, $ZrO_2$, $HfO_2$, $GeO_2$, $Y_2O_3$, $TiO_2$, $Ce_2O_3$, MgO, $MgO.Al_2O_3$, $SiO_2.MgO$, etc. A mixture of two or more kinds of these compounds may also be used to form the barrier layer 102.

The barrier layer 102 constituted of an electrically insulating metal oxide may be formed by the vacuum deposition method, the CVD (chemical vapor deposition) method, the glow discharge decomposition method, the sputtering method, the ion implantation method, the ion plating method, the electron-beam method or the like.

For formation of the barrier layer 102 by the sputtering method, for example, a wafer for formation of a barrier layer may be used as target and subjected to sputtering in an atmosphere of various gases such as He, Ne, Ar and the like.

When the electron-beam method is used, there is placed a starting material for formation of the barrier layer in a boat for deposition, which may in turn be irradiated by an electron-beam to effect vapor deposition of said material.

The barrier layer 102 is formed to exhibit electric insulating behavior, since the barrier layer 102 has the function of barring effectively penetration of carriers into the amorphous layer 103 from the side of the support 101 and permitting easily the photocarriers generated in the amorphous layer 103 and migrating toward the support 101 to pass therethrough from the side of the amorphous layer 103 to the side of the support 101.

The numerical range of the layer thickness of the barrier layer is an important factor to achieve effectively the above-mentioned purpose. In other words, if the layer thickness is too thin, the function of barring injection of free carriers from the side of the support 101 into the amorphous layer 103 cannot sufficiently be fulfilled. On the other hand, if the thickness is too thick, the probability of the photocarriers generated in the amorphous layer 103 to be passed to the side of the support 101 is very small. Thus, in any of the cases, the objects of this invention cannot effectively be achieved.

In view of the above points, a thickness of the barrier layer 102 is generally in the range of from 30 to 1000 Å, preferably from 50 to 600 Å or achieving the objects of the present invention.

In the present invention, in order to achieve its objects effectively, the amorphous layer 103 provided on the support 101 is constituted of a-Si(H, X) having the semiconductor characteristics as shown below, and further subjected to doping with carbon atoms distributed in the direction of the layer thickness in a fashion as hereinafter described:

1 p-type a-Si (H, X) . . . containing only acceptor; or containing both donor and acceptor with relatively higher concentration of acceptor (Na);

2 p⁻-type a-Si(H, X) . . . in the type of 1, that containing acceptor with lower acceptor concentration (Na) than 1, when containing only acceptor, or containing acceptor with relatively lower concentration as compared with 1, when containing both acceptor and donor;

3 n-type a-Si(H, X) . . . containing only donor; or containing both donor and acceptor with relatively higher concentration of donor (Nd);

4 n⁻-type a-Si(H, X) . . . in the type of 3, that containing doner at lower donor concentration (Nd) than 3, when containing only donor, or containing doner with relatively lower concentration as compared with 3, when containing both acceptor and donor;

5 i-type a-Si(H, X) . . . Na≈Nd≈0 or Na≈Nd.

In the present invention, typical examples of halogen atoms (X) contained in the amorphous layer 103 are fluorine, chlorine, bromine and iodine, and fluorine and chlorine are particularly preferred.

In the amorphous layer in the photoconductive member according to the present invention, there is provided a layer region containing carbon atoms which are distributed evenly within a plane substantially parallel to the surface of the support but unevenly in the direction of layer thickness. According to a preferred embodiment, in addition to this specific feature, carbon atoms are more enriched on the side of the surface opposite to the support (i.e. the side of the free surface 104 in FIG. 1), so that the maximum value $C_{max}$ of its distribution content may be located at the aforesaid surface or in the vicinity thereof.

In FIGS. 2 through 5, there are shown typical examples of distributions of carbon atoms in the layer thickness direction of amorphous layer contained in the amorphous layer of a photoconductive member having such carbon atom content distribution. In FIGS. 2 through 5, the axis of ordinate shows the layer thickness t of the amorphous layer 103, $t_0$ indicating the positions of the interface (lower surface) between the amorphous layer 103 and other material such as the support 101, the barrier layer 102, and the like, and $t_s$ the position of the interface (upper surface)(the same position as the free surface 104 in FIG. 1) of the amorphous layer 103 in the side of the free surface 104, wherein the layer thickness t increases from $t_0$ toward $t_s$, while the axis of abscissa shows the distribution content of carbon atoms, C, at any position in the layer thickness direction in the amorphous layer 103, wherein the increase of distribution content is indicated in the direction of the arrowhead and $C_{max}$ indicates the maximum distribution content of carbon atoms at a certain position in the direction of the thickness layer of the amorphous layer 103.

Figure 2:
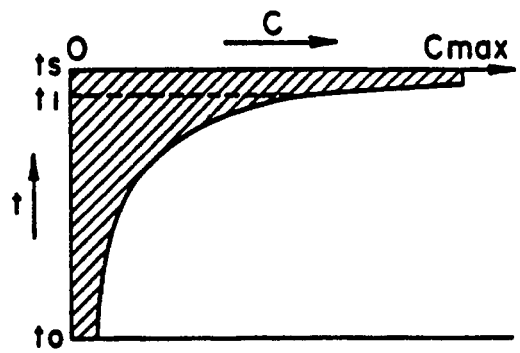
FIGS. 2 through 12 are schematic illustrations indicating distribution profiles of carbon atoms in the amorphous layers of preferred embodiments of the photoconductive members according to the present invention, respectively.

In the embodiment as shown in FIG. 2, the content of carbon atoms contained in the amorphous layer 103 is distributed in said layer 103, in such a way that the content of carbon atoms is monotonically continuously increased from the lower surface position $t_0$ toward the upper surface position $t_s$ until reaching the maximum distribution amount $C_{max}$ at the position $t_1$, and thereafter, in the interval to the surface position $t_s$, the value $C_{max}$ is maintained without change in the distribution content, C.

When the photoconductive member 100 prepared has an amorphous layer 103 having a free surface 104 as shown in FIG. 1, it is possible to increase the content of carbon atoms in the vicinity of the upper surface position $t_s$ by far greater than in other regions, thereby to impart improved charge bearing capacity to the free surface 104. In this case, such a layer region functions as a kind of so-called barrier layer.

Thus, an upper barrier layer can be formed in the amorphous layer 103 by enriching extremely the content of carbon atoms in the vicinity of the free surface 104 of the amorphous layer 103 as compared with other layer regions. Alternatively, it is also possible to form an upper layer on the surface of the amorphous layer 103 by use of materials having the same characteristics as those of materials constituting the barrier layer 102. The upper layer in this case may suitably be 30 Å to 5 μ, preferably 50 Å to 2 μ.

Figure 3:
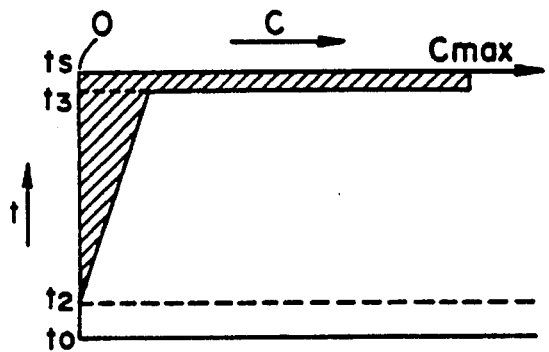

In the embodiment as shown in FIG. 3, in the layer region at the lower part between $t_0$ and $t_2$, there is contained no or less than detectable limit of carbon atom. From the position $t_2$ to $t_3$, the distribution content of carbon atoms is increased monotonically as the first-order function or approximately the first-order function, until it reaches the maximum distribution amount $C_{max}$ at the position $t_3$. In the layer region between $t_3$ and $t_s$, carbon atoms are contained uniformly in the maximum distribution content of $C_{max}$.

Thus, in FIG. 3, the drawing is depicted as if no carbon was contained at all in the interval between $t_0$ and $t_2$. This is because an amount of carbon atoms, if any, less than the detectable limit is dealt with similarly as no carbon content.

Accordingly, in the present invention, the layer region indicated as carbon content of 0 (for example, the layer region between $t_0$ and $t_2$ in FIG. 3) contains no carbon atom at all or contains carbon atoms only in an amount of less than the detectable limit. The detectable limit of carbon atoms at our present level of technology is 10 atomic ppm based on silicon atoms.

Figure 4:
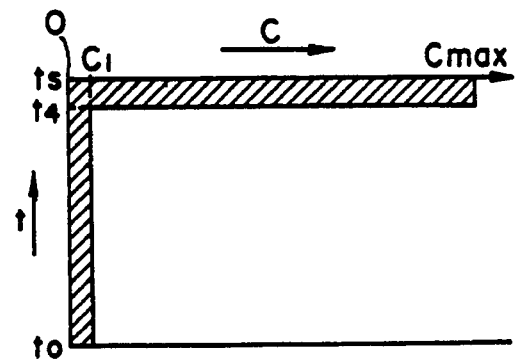

In the embodiment as shown in FIG. 4, at the lower layer region (between $t_0$ and $t_4$) in the amorphous layer 103, carbon atoms are contained uniformly and evenly with its distribution content C being constantly $C_1$, while in the upper layer region (between $t_4$ and $t_s$), carbon atoms are distributed uniformly and evenly at the maximum distribution content $C_{max}$, thus providing incontinuously different distribution contents C in lower and upper layer regions, respectively.

Figure 5:
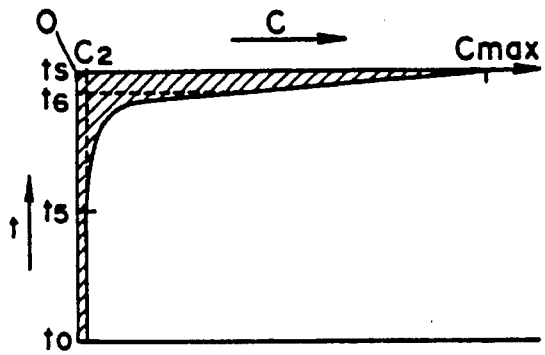

In the embodiment as shown in FIG. 5, carbon atoms are contained at a constant distribution content $C_2$ from the lower surface position $t_0$ to the position $t_5$ in the amorphous layer 103, and the distribution content of carbon atoms is gradually increased from the position $t_5$ to the position $t_6$, from which the distribution content of carbon atoms is abruptly increased to the upper surface position $t_s$, at which it reaches the maximum distribution content $C_{max}$.

As described above, as a preferred embodiment of the photoconductive member according to the present invention, it is desirable that carbon atoms are contained in the amorphous layer 103 so that the carbon atoms may be distributed with distribution contents increasing nearer to the upper surface position $t_s$, in order to obtain a high photosensitization and stable image characteristics.

In case of such distributions as shown in the embodiments in FIG. 2 through 5 wherein the carbon atoms contained in the amorphous layer 103 are distributed in the layer thickness direction with more enrichment on the side opposite to the support 101, the total content of carbon atoms $C_t$ contained in the whole layer region is generally 0.005 to 30 atomic % based on silicon atoms, and the maximum distribution content $C_{max}$ at the surface or in the vicinity of said surface opposite to the support 101 in said layer region is generally 0.03 to 90 atomic %, preferably 0.05 to 90 atomic %, most preferably 0.1 to 90 atomic %.

In the preferred embodiments of the photoconductive members of this invention as shown in FIG. 2 through FIG. 5, the intended object of the present invention can be effectively accomplished by adding carbon atoms into the amorphous layer 103 according to a desired distribution function so that the carbon atoms contained in the amorphous layer 103 may be distributed unevenly in the layer thickness direction of the amorphous layer 103, and while having the maximum distribution content $C_{max}$ at the upper surface position $t_s$ or in the vicinity of $t_s$, the distribution content being decreased from the upper surface position $t_s$ toward the lower surface position $t_0$. Further, the total content of carbon atoms in the whole amorphous layer is also important to accomplish the objects of the present invention.

The total amount of carbon atoms contained in the amorphous layer is generally within the range as specified above, but it is preferably 0.005 to 20 atomic % relative to silicon atoms, most preferably 0.005 to 10 atomic %.

In FIGS. 6 through 12, there is shown another preferred embodiment of the photoconductive member of this invention, having at least a layer region, in which carbon atoms contained in the amorphous layer 103 are substantially uniformly distributed in planes approximately parallel to the surface of the support but distributed unevenly in the thickness direction of the layer, the carbon atoms being distributed more enriched on the side of the surface at which the support 101 is provided than in the central portion of said layer region.

In the embodiment as shown in FIGS. 6 through 12, as distinguished from the embodiment as shown in FIGS. 2 through 5, the amorphous layer 103 has at least a layer region, having the peak of distribution of carbon atoms at the surface on the side at which the support 101 is provided or in the vicinity of said surface.

The meanings of the ordinate and abscissa axes in FIGS. 6 through 12 are the same as in FIGS. 2 through 5, and the carbon content indicated as 0 means that the content of carbon atoms is substantially 0, as described previously with respect to FIGS. 2 through 5. And, the fact that the content of carbon atoms is substantially 0 means that the amount of carbon atoms in the portion of the layer region is less than the detectable limit as described above, thus including the case wherein carbon atoms are actually contained in an amount less than the detectable limit.

Figure 6:
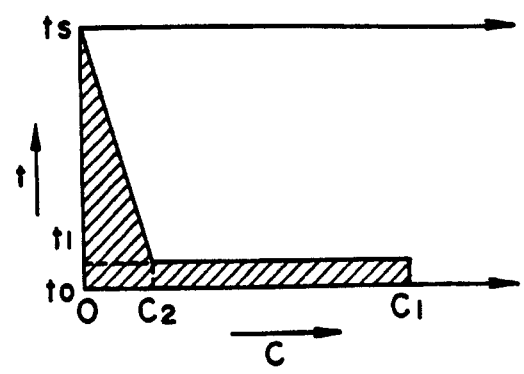

In the embodiment as shown in FIG. 6, the content of carbon atoms in the amorphous layer 103 is distributed through said layer 103 such that the distribution content from the lower surface position $t_0$ to the position $t_1$ is constantly $C_1$, and the distribution content is decreased as a first-order function from the distribution content $C_2$ from the position $t_1$ to the upper surface position $t_s$, until the content of carbon atoms becomes substantially 0 on reaching the upper surface position $t_s$.

In the embodiment of FIG. 6, by increasing extremely the distribution content C between the layer thickness positions $t_0$ and $t_1$, the amorphous layer 103 can be sufficiently endowed with the function of a barrier layer at its lower surface layer region.

Figure 7:
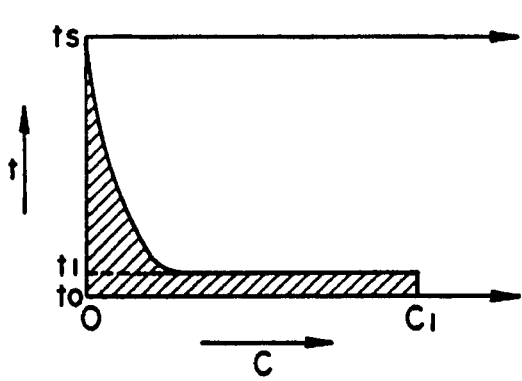

In the embodiment as shown in FIG. 7, the distribution of carbon atoms contained in the amorphous layer 103 is such that the distribution content $C_1$ is constant from the lower surface position $t_0$ to the position $t_1$, and the distribution content is gradually decreased with a gentle curve from the position $t_1$ toward the upper surface position $t_s$.

Figure 8:
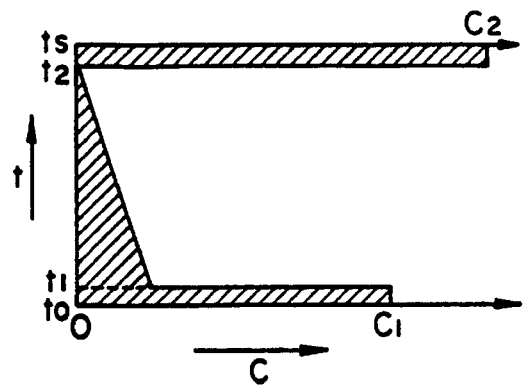

In the embodiment as shown in FIG. 8, the distribution content is constantly $C_1$ from $t_0$ to $t_1$, decreased as a first-order function from $t_1$ to $t_2$ and again becomes constant at $C_2$ from $t_2$ to $t_s$. In this embodiment, the upper surface layer region of the amorphous layer 103 can have sufficiently the function of a barrier layer by incorporating carbon atoms in an amount enough to give a distribution content $C_2$ in the upper surface layer region (the portion between $t_2$ and $t_s$ in FIG. 8) which can exhibit a barrier layer function.

Alternatively, it is also possible in case of the embodiment as shown in FIG. 8 to increase the distribution contents C of carbon atoms at both surface sides of the amorphous layer 103 by far greater than that in the internal portion, thereby permitting the both surface layer regions to fulfill the functions of barrier layers.

Figure 9:
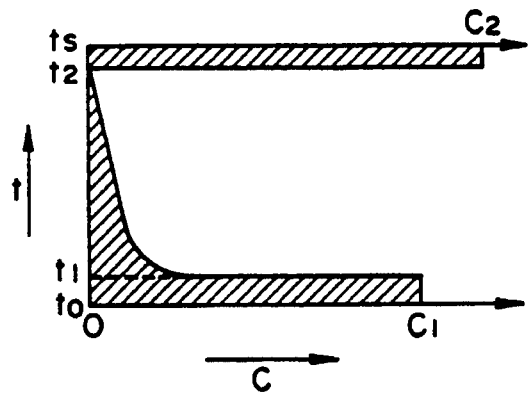

In the embodiment as shown in FIG. 9, the distribution profile of carbon atoms between $t_0$ and $t_2$ is similar to that as shown in FIG. 7, but the distribution content is abruptly increased incontinuously between $t_2$ and $t_s$ to have a value of $C_2$, thus giving a different distribution profile as a whole.

Figure 10:
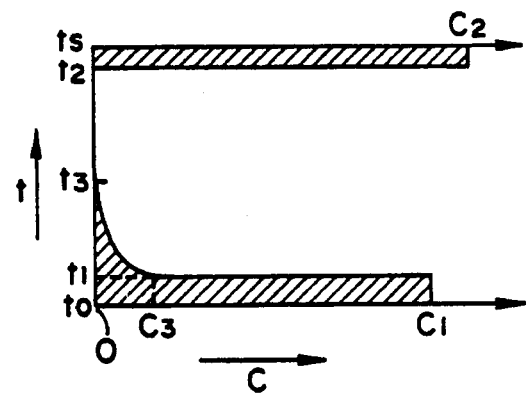

In the embodiment as shown in FIG. 10, the distribution profile is similar to that as shown in FIG. 7 between $t_0$ and $t_3$, but there is formed a layer region with carbon content of substantially zero between $t_3$ and $t_2$, while a large amount of carbon atoms are contained between $t_2$ and $t_s$ to provide a distribution content of $C_2$.

Figure 11:
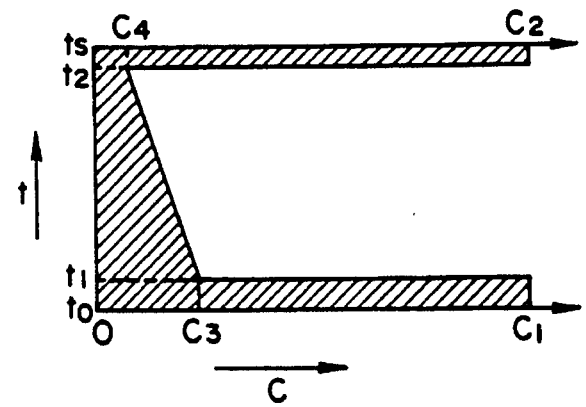

In the embodiment as shown in FIG. 11, the distribution content is constantly $C_1$ between $t_0$ and $t_1$, decreased from the distribution content $C_3$ to $C_4$ as a first-order function between $t_1$ and $t_2$ from the side of $t_1$, and again increased between $t_2$ and $t_s$ up to a constant value $C_2$.

Figure 12:
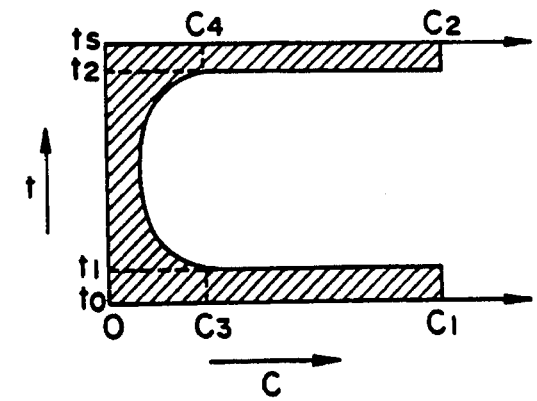

In the embodiment as shown in FIG. 12, the distribution content is constantly $C_1$ between $t_0$ and $t_1$, and also there is formed a distribution profile with a constant distribution content of $C_2$ between $t_2$ and $t_s$, while the distribution content gradually decreasing between $t_2$ and $t_1$ from the $t_1$ side toward the central portion of the layer and again gradually increasing from said central portion to $t_2$, at which the distribution content reaches the value of $C_4$.

As described above, in the embodiment as shown in FIGS. 6 through 12, there is provided a layer region having a peak of distribution content on the surface of the amorphous layer 103 on the side of the support 102 or in the vicinity of said surface, where carbon atoms are more enriched than in the central portion of said amorphous layer 103. Moreover, if necessary, it is also possible to provide a layer region having more content of carbon atoms than that in the central portion of the amorphous layer 103 also in the surface region of the amorphous layer 103 being the opposite side to the support. Further, there may also be formed a layer region extremely enriched in content of carbon atoms at the lower surface or in the vicinity of said surface so that the function of a barrier layer may sufficiently be exhibited.

In the embodiments as shown in FIGS. 6 through 12, the peak value $C_{max}$ of the distribution content of carbon atoms contained in the amorphous layer 103 in the layer thickness direction may generally range from 0.03 to 90 atomic % to achieve effectively the objects of this invention, preferably from 0.05 to 90 atomic %, most preferably 0.1 to 90 atomic %.

In the photoconductive member according to the present invention, in case of the embodiments as shown in FIGS. 6 through 12, the carbon atoms are contained in the amorphous layer 103 with an uneven distribution of its content in the layer thickness direction of said amorphous layer 103, assuming a distribution profile such that its distribution content is decreased from the vicinity of the lower surface layer region toward the central portion of said amorphous layer 103. However, the total content of carbon atoms contained in the amorphous layer 103 is also another critical factor to achieve the objects of the present invention.

In the present invention, the total content of carbon atoms in the amorphous layer 103 is generally 0.005 to 30 atomic % based on silicon atoms, preferably 0.005 to 20 atomic %, most preferably 0.005 to 10 atomic %.

FIG. 13 shows a schematic sectional view of still another preferred embodiment of the photoconductive member according to the present invention.

The photoconductive member 1300 as shown in FIG. 13, similarly to that described with reference to FIG. 1, comprises a support 1301 for the photoconductive member, a barrier layer 1302 optionally provided on said support 1301, and an amorphous layer 1303, said amorphous layer 1303 containing carbon atoms which are distributed substantially equally within planes substantially parallel to the surface of said support 1301 but unevenly in the thickness direction of said layer, with different distributions in respective portions of the layer regions 1304, 1305 and 1306. That is, the amorphous layer 1303 is constituted of a lower layer region 1304 in which carbon atoms are distributed in the layer thickness direction substantially uniformly with a distribution content of $C_1$, an upper layer 1306 in which carbon atoms are distributed in the layer thickness direction substantially uniformly with a distribution content of $C_2$, and an intermediate layer region 1305, sandwiched between both of these layer regions, in which carbon atoms are distributed in the layer thickness direction substantially uniformly with a distribution content of $C_3$.

In the embodiment as shown in FIG. 13, the values of distribution content $C_1$, $C_2$ and $C_3$ of carbon atoms in respective layer can be variable as desired within the relationship $C_3 < C_1, C_2$. But in order to achieve the objects of the present invention more effectively, the upper limit of the distribution content $C_1$ or $C_2$ is generally 90 atomic % or lower, preferably, 80 atomic % or lower, most preferably 78 atomic % or lower, its lower limit being generally 11 atomic % or higher, preferably 15 atomic % or higher, most preferably 20 atomic % or higher. As for the value of the distribution amount $C_3$, its upper limit may generally be 10 atomic % or lower, preferably 5 atomic %, most preferably 2 atomic %, while the lower limit generally 0.001 atomic % or higher, preferably 0.002 atomic % or higher, most preferably 0.003 atomic % or higher.

The total content of carbon atoms in the amorphous layer 1303 may be generally in the range from 0.005 to 30 atomic % based on silicon atoms, preferably from 0.005 to 20 atomic %, most preferably from 0.005 to 10 atomic %.

The barrier layer 1302 is not necessarily required to be provided in the present invention, as described above with reference to FIG. 1, if the same function as the barrier layer 1302 as described above can be sufficiently exhibited at the interface formed between the support 1301 and the amorphous layer 1303 when said amorphous layer is provided directly on said support 1301.

Further, by incorporating a sufficient quantity of carbon atoms as desired in the surface layer region in the amorphous layer 1303 on the side of the support 1301, a part of the layer region of the amorphous layer 1303 can be endowed with the same function as the barrier layer 1302, whereby the barrier layer 1302 can also be dispensed with. When a part of layer region of the amorphous layer 1303 is loaded with the function of a barrier layer, the content of carbon atoms necessary for the layer region exhibiting such a function is generally 30 to 90 atomic % based on silicon atoms, preferably 40 to 90 atomic %, most preferably 50 to 90 atomic %.

In the present invention, formation of an amorphous layer constituted essentially of a-Si (H, X) may be conducted according to the vacuum deposition method utilizing discharging phenomenon, such as glow discharge method, sputtering method or ion-plating method. For example, for formation of the amorphous layer according to the glow discharge method, a starting gas for incorporation of hydrogen atoms and/or halogen atoms is introduced together with a starting gas for supplying silicon atoms (Si), capable of supplying silicon atoms (Si), into the deposition chamber, wherein glow discharge is generated thereby to form a layer constituted of a-Si (H, X) on the surface of the given support placed previously on the predetermined position. For incorporation of carbon atoms (C) into the amorphous layer to be formed, a starting gas for incorporation of carbon atoms may be introduced into said deposition chamber at the time of forming said amorphous layer.

When it is to be formed according to the sputtering method, a starting gas for incorporation of hydrogen atoms and/or halogen atoms may be introduced into the chamber for sputtering, when effecting sputtering upon the target formed of Si in an atmosphere of an inert gas such as Ar, He or a gas mixture based on these gases.

As the method for incorporating carbon atoms into the amorphous layer, a starting gas for incorporating carbon atoms may be introduced into said deposition chamber at the time of layer formation with the growth of the layer, or alternatively at the time of layer formation the target for incorporation of carbon atoms previously provided in the deposition chamber may be subjected to sputtering.

The starting gas for supplying Si to be used in forming the amorphous layer according to the present invention may include gaseous or gasifiable silicon hydrides (silanes) such as $SiH_4$, $Si_2H_6$, $Si_3H_8$, $Si_4H_{10}$, and the like as effective materials. In particular, $SiH_4$ and $Si_2H_6$ are preferred with respect to easy handling during layer formation and efficiency for supplying Si.

As the effective starting gas for incorporation of halogen atoms to be used in forming the amorphous layer according to the present invention, there may be mentioned a number of halogen compounds such as halogen gases, halides, interhalogen compounds and silane derivatives substituted with halogens which are gaseous or gasfiable.

Alternatively, it is also effective in the present invention to use gaseous or gasifiable silicon compounds containing halogen atoms, which are constituted of both silicon atoms (Si) and halogen atoms (X).

Typical examples of halogen compounds preferably used in the present invention may include halogen gases such as of fluorine, chlorine, bromine or iodine and interhalogen compounds such as BrF, ClF, $ClF_3$, $BrF_5$, $BrF_3$, $IF_7$, $IF_5$, ICl, IBr, etc.

As the silicon compound containing halogen atoms, silicon halides such as $SiF_4$, $Si_2F_6$, $SiCl_4$, $SiBr_4$, or the like are preferred.

When the specific photoconductive member of this invention is formed according to the glow discharge method by use of a silicon compound containing halogen atoms, it is possible to form an amorphous layer of a-Si:X on the support without use of a silicon hydride gas as the starting gas capable of supplying Si.

The basic procedure for forming the amorphous layer containing halogen atoms according to the glow discharge method comprises introducing a starting gas for supplying Si, namely a silicon halide gas and a gas such as Ar, $H_2$, He, etc. at a predetermined ratio in a suitable gas flow quantity into the deposition chamber for formation of the amorphous layer, followed by excitation of glow discharge to form a plasma atmosphere of these gases, thereby forming an amorphous layer on a predetermined support. For the purpose of incorporating hydrogen atoms, it is also possible to form an amorphous layer by mixing a gas of a silicon compound containing hydrogen atoms at a suitable ratio with these gases.

Each of the gases for introduction of respective atoms may be either a single species or a mixture of plural species at a predetermined ratio. For formation of an amorphous layer of a-Si (H, X) by the reaction sputtering method or the ion-plating method, a target of Si is used and sputtering is effected thereon in a suitable gas plasma atmosphere in case of the sputtering method. Alternatively, in case of ion-plating method, a polycrystalline or single crystalline silicon is placed as vaporization source in a vapor deposition boat, and the silicon vaporization source is vaporized by heating according to resistance heating method or electron beam method (EB method) thereby to permit vaporized flying substances to pass through a suitable gas plasma atmosphere.

During this procedure, in either of the sputtering method or the ion-plating method, for incorporation of halogen atoms into the layer formed, a gas of a halogen compound as mentioned above or a silicon compound containing halogen as mentioned above may be introduced into the deposition chamber to form a plasma atmosphere of said gas therein.

When incorporating hydrogen atoms, a starting gas for incorporation of hydrogen atoms such as $H_2$ or silanes as mentioned above may be introduced into a deposition chamber for sputtering, wherein a plasma atmosphere of said gas may be formed.

The carbon atoms contained in the amorphous layer formed with a desired distribution profile in the direction of the layer thickness may be introduced in the amorphous layer by introducing a starting gas for introducing carbon atoms at the time of layer formation as matching with growth of the layer according to the predetermined flow amount into the deposition chamber for formation of said layer, with the amorphous layer being formed according to the glow discharge method, ion-plating method or reaction sputtering method.

For formation of the amorphous layer according to the sputtering method, a target for introduction of carbon atoms may be provided in the aforesaid deposition chamber, and sputtering may be effected on said target as matching with the growth of the layer.

These halides containing hydrogen atoms may preferably be used as starting materials for incorporation of halogen atoms, since hydrogen atoms, which are very effective for controlling electrical or photoelectric properties, can be introduced simultaneously with introduction of halogen atoms.

Other than the method as described above, hydrogen atoms may also be introduced structurally into the amorphous layer by exciting discharging in the deposition chamber in the co-presence of $H_2$ or silane gases such as $SiH_4$, $Si_2H_6$, $Si_3H_8$, $Si_4H_{10}$, and the like with silicon compounds as a source for supplying Si.

For example, in case of the reaction sputtering method, using Si target, a gas for incorporation of halogen atoms and $H_2$ gas, optionally together with an inert gas such as He, Ar, and the like are introduced into the deposition chamber to form a plasma atmosphere therein, followed by sputtering of said Si target, whereby there can be obtained an amorphous layer essentially constituted of a-Si (H, X) having desired characteristics.

Furthermore, a gas such as $B_2H_6$, $PH_3$, $PF_3$, and the like can be also introduced with the gases as mentioned above to thereby effect also doping of impurities.

The amount of hydrogen atoms (H) or halogen atoms (X) contained in the amorphous layer of the amorphous layer of the photoconductive member according to the present invention, or total amount; of both of these atoms, may generally be 1 to 40 atomic %, preferably 5 to 30 atomic %.

The content of H and/or X incorporated in the amorphous layer can be controlled by controlling, for example, the temperature of the deposition support and/or the amounts of the starting materials used for incorporation of H or X introduced into the deposition chamber, discharging power, etc.

In order to make the amorphous layer n-type, p-type or i-type, either or both of n-type and p-type impurities which control the electric conduction type can be added into the layer in a controlled amount during formation of the layer by the glow discharge method or the reaction sputtering method.

As the impurity to be added into the amorphous layer to make it inclined for i-type or p-type, there may be mentioned preferably an element in the group IIIA of the periodic table, for example, B, Al, Ga, In, Tl, etc.

On the other hand, for making the layer inclined for n-type, there may preferably be used an element in the group VA of the periodic table, such as N, P, As, Sb, Bi, etc.

The amount of the impurity to be added into the amorphous layer in the present invention, in order to have a desired conduction type, may be in the range of $3\times10^{-2}$ atomic % or less in case of an impurity in the group IIIA of the periodic table, and $5 \times 10^{-3}$ atomic % or less in case of an impurity in the group VA of the periodic table.

In the present invention, the substances effectively used as the starting materials for incorporation of the carbon atoms to be used for incorporating carbon atoms in the amorphous layer may include a large number of carbon compounds which are gaseous or easily gasifiable. Examples of such substances are hydrocarbons constituted of carbon atoms(C) and hydrogen atoms(H) such as saturated hydrocarbons having 1 to 5 carbon atoms, ethylenic hydrocarbons having 2 to 5 carbon atoms and acetylenic hydrocarbons having 2 to 4 carbon atoms.

More specifically, typical examples are saturated hydrocarbons such as methane ($CH_4$), ethane ($C_2H_6$), propane ($C_3H_8$), n-butane (n-$C_4H_{10}$), pentane ($C_5H_{12}$) and the like; ethylenic hydrocarbons such as ethylene ($C_2H_4$), propylene($C_3H_6$), butene-1 ($C_4H_8$), butene-2 ($C_4H_8$), isobutylene ($C_4H_8$), pentene ($C_5H_{10}$) and the like; and acetylenic hydrocarbons such as acetylene ($C_2H_2$), methylacetylene ($C_3H_4$), butyne ($C_4H_6$) and the like.

Other than these compounds, as starting substances for incorporation of carbon atoms constituted of Si, C and H atoms, there may also effectively be employed alkyl silanes such as Si ($CH_3)_4$, Si ($C_2H_5)_4$ and the like, halogen-containing alkyl silanes such as $SiCl(CH_3)_3$, $SiCl_2(CH_3)_2$, $SiCl_3CH_3$ and the like, halogen-substituted paraffinic hydrocarbons such as $CCl_4$, $CHF_3$, $CH_2F_2$, $CH_3Cl$, $CH_3Br$, $CH_3I$, $C_2H_5Cl$ and the like.

For formation of the amorphous layer having incorporated carbon atoms by the sputtering method, a single crystalline or polycrystalline Si wafer is subjected to sputtering in an atmosphere of a starting gas for incorporation of carbon atoms at the time of formation of the amorphous layer or alternatively a single crystalline or polycrystalline Si wafer or C wafer or a wafer containing Si and C mixed therein is used as target and subjected to sputtering.

For example, when Si wafer is used as target, a starting gas which was mentioned as a starting gas for incorporation of carbon atoms and hydrogen atoms (H) or halogen atoms(X) in the case of the glow discharge method, which may be diluted with a diluting gas, if desired, is introduced into a deposition chamber for sputter to form a gas plasma of these gases therein and effect sputtering of said Si wafer.

Alternatively, Si and C as separate targets or one sheet target of a mixture of Si and C can be used and sputtering is effected in a gas atmosphere containing at least hydrogen atoms(H) or halogen atoms(X).

In the present invention, for the purpose of obtaining the same effect as by incorporation of carbon atoms, it is also possible to incorporate oxygen atoms in addition to carbon atoms in the amorphous layer.

When the amorphous layer is formed by the glow discharge method, the starting substances for incorporation of oxygen atoms may include, for example, oxygen($O_2$), ozone ($O_3$), carbon monoxide(CO), carbon dioxide($CO_2$) or lower siloxanes such as disiloxane $H_3SiOSiH_3$, trisiloxane $H_3SiOSiH_2OSiH_3$ and the like. When forming the amorphous layer by the sputtering method, a material to be effectively used in the present invention for forming the target for incorporation of oxygen atoms may be $SiO_2$, SiO, etc.

The starting gas for producing Si to be used for formation of the amorphous layer in the present invention may include gaseous or gasifiable hydrogenated silicons (silanes) such as $SiH_4$, $Si_2H_6$, $Si_3H_8$, $Si_4H_{10}$ and others as effective materials.

In particular, $SiH_4$ and $Si_2H_6$ are preferred with respect to easy handling during layer formation and efficiency for producing Si.

As the effective starting gas for incorporation of halogen atoms to be used in the present invention, there may be mentioned a number of halogen compounds such as single substances of halogen, hydrogen halides, interhalogen compounds, silicon halides, and halogen-substituted hydrogenated silicon.

Typical examples of halogen compounds preferably used in the present invention may include halogen gases such as of fluorine, chlorine, bromine or iodine, hydrogen halides such as HF, HI, HCl, HBr and interhalogen compounds such as BrF, ClF, $ClF_3$, $ClF_5$, $BrF_5$, $BrF_3$, $IF_5$, $IF_7$, ICl, IBr, etc., silicon halides such as $SiF_4$, $Si_2F_6$, $SICl_4$, $SiCl_3Br$, $SiCl_2Br_2$, $SiClBr_3$, $SiCl_3I$, $SiBr_4$ or the like and halogen-substituted hydrogenated silicon such as $SiH_2F_2$, $SiH_2Cl_2$, $SiHCl_3$, $SiH_3Cl$, $SiH_3Br$, $SiH_2Br_2$, $SiHBr_3$, etc.

When the specific photoconductive member of this invention is formed according to the glow discharge method by use of such silicon compound containing halogen atoms as a starting gas for incorporation of halogen atoms, it is possible to form a photoconductive layer constituted of a-Si:X on a given support without use of a hydrogenated silicon gas as the starting gas capable of producing Si.

In forming an amorphous layer containing halogen atoms according to the glow discharge method, the basic procedure comprises feeding a starting gas for producing Si, namely a gas of silicon halide and a gas such as Ar, $H_2$, He, etc. at a predetermined ratio in a suitable amount into the deposition chamber for formation of an amorphous layer, followed by excitation of glow discharge to form a plasma atmosphere of these gases, thereby forming an amorphous layer on a support. It is also possible to form a layer by mixing a gas of a silicon compound containing hydrogen atoms at a suitable ratio with these gases in order to incorporate hydrogen atoms therein.

Each of the gases for incorporation of respective atoms may be either a single species or a mixture of plural species at a predetermined ratio.

For formation of an amorphous layer of a-Si(H,X) by the reaction sputtering method or the ion-plating method, for example, a target of Si is used and sputtering is effected thereon in a suitable gas plasma atmosphere in case of the sputtering method. Alternatively, in case of ion-plating method, a polycrystalline or single crystalline silicon is placed as vaporization source in a vapor deposition boat, and the silicon vaporization source is vaporized by heating by the resistance heating method or the electron beam method (EB method) thereby to permit vaporized flying substances to pass through a suitable gas plasma atmosphere.

During this procedure, in either of the sputtering method or the ion-plating method, for incorporation of halogen atoms into the layer formed, a gas of a halogen compound as mentioned above or a silicon compound containing halogen atoms as mentioned above may be introduced into the deposition chamber to form a plasma atmosphere of said gas therein.

When hydrogen atoms are to be incorporated, a starting gas for incorporation of hydrogen atoms such as $H_2$ and a gas such as silanes as mentioned above may be introduced into the deposition chamber for sputtering, followed by formation of a plasma atmosphere of said gases.

Further, there may also be introduced a gas such as of $B_2H_6$, $PH_3$, $PF_3$ or others in order to effect also doping with impurities.

The amount of hydrogen atoms(H) or halogen atoms(X) incorporated in the amorphous layer in the photoconductive member according to the present invention, or total amount (H+X) of both of these atoms, may be generally 1 to 40 atomic %, preferably 5 to 30 atomic %.

For controlling the amounts of hydrogen atoms (H) and/or halogen atoms (X) in the amorphous layer, the deposition support temperature and/or the amounts of the starting materials for incorporation of hydrogen atoms(H) or halogen atoms(X) to be introduced into the deposition device system or the discharging power may be controlled.

In order to make the amorphous layer n-type, p-type or i-type, n-type impurity, p-type impurity or both impurities can be added into the layer in a controlled amount during formation of the layer by the glow discharge method or the reaction sputtering method.

As the impurity to be added into the amorphous layer to make it i-type or p-type, there may be mentioned preferably an element in the Group IIIA of the Periodic table, for example, B, Al, Ga, In, Tl etc.

As n-type impurities, there may preferably be used an element in the Group VA of the Periodic table, such as N, P, As, Sb, Bi, etc.

The amount of the impurity to be added into the amorphous layer, in order to have a desired conduction type, is in the range of an impurity in the Group IIIA of the Periodic table, up to $3\times10^{-2}$ atomic % and in the case of an impurity in the Group VA of the Periodic table, $5\times10^{-3}$ atomic % or less.

The layer thickness of the amorphous layer may be determined suitably as desired so that the photocarriers generated in the amorphous layer may be transported efficiently in a certain direction, but is generally in the range from 3 to 100 μ, preferably from 5 to 50 μ.

EXAMPLE 1

Using a device as shown in FIG. 14 placed in a clean room which had been completely shielded, an image-forming member for electrophotography was prepared according to the following procedures.

A molybdenum plate (substrate) 1409 of 10 cm square having a thickness of 0.5 mm, whose surface had been cleaned, was fixed firmly on a supporting member 1403 disposed at a predetermined position in a glow discharge deposition chamber 1401. The substrate 1409 was heated by a heater 1408 within the supporting member 1403 with a precision of ±0.5° C. The temperature was measured directly at the backside of the substrate by an alumel-chromel thermocouple. Then, after confirming that all of the valves in the system were closed, the main valve 1410 was opened, and evacuation of the chamber 1401 was effected to about $5\times10^{-6}$ Torr. Thereafter, the input voltage for the heater 1408 was elevated by varying the input voltage while detecting the substrate temperature until the temperature was stabilized constantly at 250° C.

Then, the auxiliary valve 1441, subsequently the outflow valves 1426, 1427, 1429 and the inflow valves 1421, 1422, 1424 were opened fully to effect degassing sufficiently in the mass flow controllers 1416, 1417, 1419 to vacuo. After closing the auxiliary valve 1441 and the valves 1426, 1427, 1429, 1421, 1422, 1424, the valve 1431 of the bomb 1411 containing $SiH_4$ gas (purity: 99.999%) diluted to 10 vol % with $H_2$ [hereinafter referred to as $SiH_4(10)/H_2$] and the valve 1432 of the bomb 1412 containing $C_2H_4$ gas (purity: 99.999%) diluted with $H_2$ to 0.1 vol. % [hereinafter referred to as $C_2H_4(0.1)/H_2$] were respectively opened to adjust the pressures at the outlet pressure gages 1436 and 1437, respectively, at 1 kg/cm², whereupon the inflow valves 1421 and 1422 were gradually opened to permit $SiH_4(10)/H_2$ gas and $C_2H_4(0.1)/H_2$ gas to flow into them ass flow controllers 1416 and 1417, respectively. Subsequently, the outflow valves 1426 and 1427 were gradually opened, followed by opening of the auxiliary valve 1441. The mass flow controllers 1416 and 1417 were adjusted thereby so that the gas feed ratio of $SiH_4(10)/H_2$ to $C_2H_4(0.1)/H_2$ was 10:0.3. Then, while carefully reading the Pirani gage 1442, the opening of the auxiliary valve 1441 was adjusted and opened to the extent until the inner pressure in the chamber 1401 became $1\times10^{-2}$ Torr. After the inner pressure in the chamber 1401 was stabilized, the main valve 1410 was gradually closed to narrow its opening until the indication on the Pirani gage 1442 became 0.1 Torr.

After confirming that the gas feeding and the inner pressure were stable, followed by turning on the switch of the high frequency power source 1443 and closing the shutter 1405 (which was also the electrode), a high frequency power of 13.56 MHz was applied between the electrode 1403 and the shutter 1405 to generate glow discharging in the chamber 1401 to provide an input power of 10 W. The above conditions were maintained for 3 hours to form a lower region layer constituting the amorphous layer. Thereafter, with the high frequency power source 1443 being turned off for intermission of the glow discharge, the outflow valve 1427 was closed, and then under the pressure of 1 kg/cm² (reading on the outlet pressure gage 1439) of the $C_2H_4$ gas bomb 1414 through the valve 1434, the inflow valve 1424 and the outflow valve 1429 were gradually opened to permit $C_2H_4$ gas to flow into the mass flow controller 1419, and the flow amount ratio of $C_2H_4$ gas to $SiH_4$ (10)/$H_2$ gas was adjusted by the mass flow controller 1419 to 1:10.

Subsequently, the high frequency power source 1443 was turned on again to recommence glow discharge. The input power was 3 W. After glow discharging was maintained for 10 minutes to form an upper region layer constituting the amorphous layer to a thickness of 600 Å, the heater 1408 was turned off, with the high frequency power source 1443 being also turned off, the substrate was left to cool to 100° C., whereupon the outflow valves 1426, 1429 and the inflow valves 1421, 1422, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate having formed respective layers was taken out. In this case, the entire thickness of the layers was about 9 μ.

The thus prepared image-forming member was placed in an experimental device for charging and exposure to light, and corona charging was effected at ⊖ 5.5 KV for 0.2 sec., followed immediately by irradiation of a light image. The light image was irradiated through a transmission type test chart using a tungsten lamp as light source at a dosage of 1.0 lux.sec.

Immediately thereafter, positively ⊕ charged developers (containing toner and carrier) were cascaded on the surface of the image-forming member to obtain a good toner image on the image-forming member. When the toner image on the image-forming member was transferred on a transfer paper by corona charging at ⊖ 5.0 KV, there was obtained a clear image of high density which was excellent in resolution as well as gradation reproducibility.

EXAMPLE 2

A molybdenum substrate was set similarly as in Example 1, followed by evacuation of the glow discharge deposition chamber 1401 to $5\times10^{-6}$ Torr according to the same procedures as in Example 1. After the substrate temperature was maintained at 250° C., according to the same procedures as in Example 1, the auxiliary valve 1441, subsequently the outflow valves 1426, 1427, 1429 and inflow valves 1421, 1422, 1424, were fully opened thereby to effect sufficiently degassing of the mass flow controllers 1416, 1417, 1419 to vacuo. After closing of the auxiliary valve 1441 and the valves 1426, 1427, 1429, 1421, 1422, 1424, the valve 1431 of the $SiH_4$ (10)/$H_2$ gas bomb 1411 and the valve 1432 of the $C_2H_4$ (0.1)$H_2$ gas bomb 1412 were opened to adjust the pressure at the outlet pressure gages 1436 and 1437 respectively, at 1 $kg/cm^2$, whereupon the inflow valves 1421 and 1422 were gradually opened to permit $SiH_4$ (10)/$H_2$ gas and $C_2H_4$ (0.1)/$H_2$ gas to flow into the mass flow controllers 1416 and 1417, respectively. Subsequently, the outflow valves 1426 and 1427 were gradually opened, followed by gradual opening of the auxiliary valve 1441. The mass flow controllers 1416 and 1417 were adjusted thereby so that the gas feed ratio of $SiH_4(10)/H_2$ to $C_2H_4(0.1)/H_2$ was 10:0.3. Then, while carefully reading the Pirani gage 1442, the opening of the auxiliary valve 1441 was adjusted and opened to the extent until the inner pressure in the chamber 1401 became $1\times10^{-2}$ Torr. After the inner pressure in the chamber 1401 was stabilized, the main valve 1410 was gradually closed to narrow its opening until the indication on the Pirani gage 1442 became 0.1 Torr. After confirming that the gas feeding and the inner pressure were stable, followed by closing of the shutter 1405 (which was also the electrode), the switch of the high frequency power source 1443 was turned on to input, and a high frequency power of 13.56 MHz between the electrode 1403 and the shutter 1405 to generate glow discharging in the chamber 1401 to provide an input power of 10 W. Under the above conditions, the value of flow amount set for the mass flow controller 1417 was increased simultaneously with commencement of formation of a lower region layer constituting the amorphous layer on the substrate over 5 hours, so that the gas feed ratio of $SiH_4$ (10)/$H_2$ gas to $C_2H_4$ (0.1)/$H_2$ gas could become 1:1 after 5 hours.

Thereafter, with the high frequency power source 1443 being turned off for intermission of the glow discharge, the outflow valve 1427 was closed, and then under the pressure of 1 $kg/cm^2$ (reading on the outlet pressure gage 1439) of the $C_2H_4$ gas bomb 1414 through the valve 1434, the inflow valve 1424 and the outflow valve 1429 were gradually opened to permit $C_2H_4$ gas to flow into the mass flow controller 1419, and the flow amount ratio of $C_2H_4$ gas to $SiH_4(10)/H_2$ gas was adjusted by the mass flow controller 1419 to 1:10.

Subsequently, the high frequency power source 1443 was turned on again to recommence glow discharge. The input power was 3 W.

After glow discharging was thus maintained for 15 minutes to form an upper region layer, the heater 1408 was turned off, with the high frequency power source 1443 being also turned off, the substrate was left to cool to 100° C., whereupon the outflow valves 1426, 1429 and the inflow valves 1421, 1422, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate having formed respective layers was taken out. In this case, the entire thickness of the layers was about 15 μ.

Using the image-forming member, image was formed on a transfer paper according to the same procedure and under the same conditions as in Example 1, whereby a very clear image quality was obtained.

EXAMPLE 3

A molybdenum substrate was set similarly as in Example 1, followed by evacuation of the glow discharge deposition chamber 1401 to $5\times10^{-6}$ Torr according to the same procedures as in Example 1. After the substrate temperature was maintained at 250° C., according to the same procedures as in Example 1, the auxiliary valve 1441, subsequently the outflow valves 1426, 1427 and inflow valves 1421, 1422 were fully opened thereby to effect sufficiently degassing of the mass flow controllers 1416, 1417 to vacuo. After closing of the auxiliary valve 1441 and the valves 1426, 1427, 1421, 1422, the valve 1431 of $SiH_4(10)/H_2$ gas bomb 1411 and the valve 1432 of the $C_2H_4(0.1)/H_2$ gas bomb 1412 were opened to adjust the pressures at the outlet pressure gages 1436, 1437 respectively, to 1 $kg/cm^2$, followed by gradual opening of the inflow valves 1421, 1422 to permit the $SiH_4(10)/H_2$ gas and $C_2H_4(0.1)/H_2$ gas to flow into the mass flow controllers 1416 and 1417, respectively. Subsequently, the outflow valves 1426 and 1427 were gradually opened, followed by gradual opening of the auxiliary valve 1441. The inflow valves 1421 and 1422 were adjusted thereby so that the gas feed ratio of $SiH_4$ (10)/$H_2$ to $C_2H_4$ (0.1)/$H_2$ could be 10:0.3.

Then, while carefully reading the Pirani gage 1442, the opening of the auxiliary valves 1441 was adjusted and it was opened to the extent until the inner pressure in the chamber 1401 became $1\times10^{-2}$ Torr. After the inner pressure in the chamber 1401 was stabilized, the main valve 1410 was gradually closed to narrow its opening until the indication on the Pirani gage 1441 became 0.1 Torr. After confirming that the gas feeding and the inner pressure were stable, followed by closing of the shutter 1405 (which was also the electrode), the switch of the high frequency power source 1443 was turned on to input a high frequency power of 13.56 MHz between the electrodes 1403 and 1405 to generate glow discharging in the chamber 1401 to provide an input power of 10 W. Simultaneously with commencement of formation of the amorphous layer on the substrate under the above initial layer forming conditions, the setting value of flow amount at the mass flow controller 1417 was continuously increased over 5 hours and formation of the amorphous layer was conducted by controlling the gas feed ratio of $SiH_4(10)/H_2$ to $C_2H_4(0.1)/H_2$ after 5 hours from commencement of layer formation to 1:10.

After the amorphous layer was thus formed, the heater 1408 was turned off, with the high frequency power source 1443 being also turned off, and the substrate was left to cool to 100° C., whereupon the outflow valves 1426, 1427 and the inflow valves 1421, 1422 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate having formed respective layers was taken out. In this case, the entire thickness of the layers formed was about 15 μ. Using this image-forming member, image was formed on a transfer paper under the same conditions and according to the same procedures as in Example 1, whereby there was obtained a very clear image.

EXAMPLE 4

An amorphous layer was formed on a molybdenum substrate under the same operational conditions as described in Example 3 except for the following conditions. Namely, the $SiH_4(10)/H_2$ gas bomb 1411 was replaced with the bomb containing $SiF_4$ gas (purity: 99.999%), and the $C_2H_4(0.1)/H_2$ gas bomb 1412 with the argon gas (purity: 99.999%) bomb containing 0.2 vol. % of $C_2H_4$ [hereinafter abridged as $C_2H_4(0.2)/Ar$]. The feed gas ratio of $SiF_4$ gas to $C_2H_4(0.2)/Ar$ at the initial stage of deposition of the amorphous layer was set at 1:0.6, and the flow amount of $C_2H_4(0.2)/Ar$ was continuously increased after commencement of the layer formation so that said feed gas ration could become 1:18 at the completion of deposition of the amorphous layer. Further, the input power for glow discharging was changed to 100 W. The layer thickness formed in this case was about 18 μ. The thus prepared image-forming member was tested for image formation on a transfer paper according to the same procedures as in Example 1, whereby a very clear image was obtained.

EXAMPLE 5

A molybdenum substrate was set similarly as in Example 1, followed by evacuation of the glow discharge deposition chamber 1401 to $5\times10^{-6}$ Torr according to the same procedures as in Example 1. After the substrate temperature was maintained at 250° C., according to the same procedures as in Example 1, the auxiliary valve 1441, subsequently the outflow valves 1426, 1427, 1428, 1429 and inflow valves 1421, 1422, 1423, 1424 were fully opened thereby to effect sufficiently degassing of the mass flow controllers 1416, 1417, 1418, 1419 to vacuo.

After closing of the auxiliary valve 1441 and the valves 1426, 1427, 1428, 1429, 1421, 1422, 1423, 1424, the valve 1431 of $SiH_4(10)/H_2$ gas bomb 1411, the valve 1432 of the $C_2H_4(0.1)/H_2$ gas bomb 1412, and the valve 1433 of the bomb 1413 containing $B_2H_6$ gas (purity: 99.999%) diluted to 50 vol. ppm with $H_2$ [hereinafter referred to as $B_2H_6(50)/H_2$] were opened to adjust the pressures at the outlet pressure gages 1436, 1437, 1438, respectively, to 1 kg/cm², followed by gradual opening of the inflow valves 1421, 1422, 1423 to permit the $SiH_4(10)/H_2$ gas, $C_2H_4(0.1)/H_2$ gas and $B_2H_6(50)/H_2$ gas to flow into the mass flow controllers 1416, 1417, 1418, respectively. Subsequently, the outflow valves 1426, 1427, 1428 were gradually opened, followed by gradual opening of the auxiliary valve 1441. The mass flow controllers 1416, 1417 were thereby adjusted so that the gas feed ratio of $SiH_4(10)/H_2$ to $C_2H_4(0.1)/H_2$ could be 10:0.3 and that of $SiH_4(10)/H_2$ to $B_2H_6(50)/H_2$ 50:1. Then, while carefully reading the Pirani gage 1442, the opening of the auxiliary valve 1441 was adjusted and it was opened to the extent until the inner pressure in the chamber 1401 became $1\times10^{-2}$ Torr. After the inner pressure in the chamber 1401 was stabilized, the main valve 1410 was gradually closed to narrow its opening until the indication on the Pirani gage 1442 became 0.1 Torr. After confirming that the gas feeding and the inner pressure were stable, the switch of the high frequency power source 1443 was turned on with closing of the shutter (which was also the electrode) to input a high frequency power of 13.56 MHz between the electrode 1403 and the shutter 1405 to generate glow discharging in the chamber 1401 to provide an input power of 10 W. The above conditions were maintained for 3 hours to form a lower region layer constituting the amorphous layer. Then, with the high frequency power source 1443 turned off for intermission of the glow discharge, the outflow valves 1427 and 1428 were closed. By opening gradually the inflow valve 1424 and the outflow valve 1429, $C_2H_4$ gas was permitted to flow into the mass flow controller 1419 from the $C_2H_4$ gas bomb 1414 through the valve 1434 at a gas pressure of 1 kg/cm² (reading on the outlet pressure gage 1439), and the flow amount of $C_2H_4$ gas was controlled to 1/10 of the flow amount of $SiH_4(10)/H_2$ gas by controlling the mass flow controllers 1416 and 1419 and stabilized thereat.

Subsequently, the high frequency power source 1443 was turned on again to recommence glow discharge. The input power was 3 W. After glow discharge was continued for additional 10 minutes to form an upper region layer to a thickness of 600 Å, the heater 1408 was turned off, with the high frequency power source 1443 being also turned off, the substrate was left to cool to 100° C., whereupon the outflow valves 1426, 1429 and the inflow valves 1421, 1422, 1423, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers was about 9 μ. The thus prepared image-forming member was placed in an experimental device for charging and exposure to light, and corona charging was effected at ⊖ 5.5 KV for 0.2 sec., followed immediately by irradiation of a light image. The light image was irradiated through a transmission type test chart using a tungsten lamp as light source at a dosage of 1.0 lux.sec.

Immediately thereafter, positively ⊕ charged developers (containing toner and carrier) were cascaded on the surface of the image-forming member to obtain a good toner image on the image-forming member. When the toner image on the image-forming member was transferred on a transfer paper by corona charging at ⊖ 5.0 KV, there was obtained a clear image of high density which was excellent in resolution as well as gradation reproducibility.

Next, the above image-forming member was subjected to corona charging by means of a charging light-exposure experimental device at ⊕ 6.0 KV for 0.2 sec., followed immediately by image exposure to light at a dosage of 0.8 lux.sec., and immediately thereafter ⊖ charged developer was cascaded on the surface of the member. Then, by transferring on a transfer paper and fixing, there was obtained a very clear image.

As apparently seen from the above result, in combination with the previous result, the image-forming member for electrophotography obtained in this Example has the characteristics of a both-polarity image-forming member having no dependency on the charged polarity.

EXAMPLE 6

Using a device as shown in FIG. 14, an image-forming member for electrophotography was prepared according to the following procedures.

A molybdenum plate (substrate) 1409 of 10 cm square having a thickness of 0.5 mm, which surface had been cleaned, was fixed firmly on a supporting member 1403 disposed at a predetermined position in a deposition chamber 1401. The target 1404 was formed by mounting a high purity graphite (99.999%) on a high purity polycrystalline silicon (99.999%) with an area ratio of silicon to graphite being 1:9. The substrate 1409 was heated by a heater 1408 within the supporting member 1403 with a precision of ±0.5° C. The temperature was measured directly at the backside of the substrate by an alumel-chromel thermocouple. Then, after confirming that all the valves in the system were closed, the main valve 1410 was opened, and evacuation of the chamber 1401 was effected to about $5\times10^{-6}$ Torr (all the valves in the system were closed during this operation). Then, the auxiliary valve 1441, subsequently the outflow valves 1426, 1427, 1429, 1430 were opened to effect degassing sufficiently in the mass flow controllers 1416, 1417, 1419, 1420 to vacuo. Thereafter, the outflow valves 1426, 1427, 1429, 1430 and the auxiliary valve 1441 were closed. The valve 1435 of the bomb 1415 containing argon gas (purity: 99.999%) was opened to adjust the pressure at the outlet pressure gage 1440 at 1 kg/cm², whereupon the inflow valve 1425 was opened, followed by gradual opening of the outflow valve 1430 to permit Ar gas to flow into the deposition chamber 1401. The outflow valve 1430 was gradually opened until the indication on the Pirani gage 1411 became $5\times10^{-4}$ Torr. After the flow amount was stabilized under this state, the main valve 1410 was gradually closed to narrow the opening until the pressure in the chamber became $1\times10^{-2}$ Torr. After confirming that the mass flow controller 1420 was stabilized, with the shutter 1405 being opened, and then the high frequency power source 1443 was turned on to input an alternate current of 13.56 MHz, 100 W between the target 1404 and the supporting member 1403. A layer was formed while taking matching so as to continue stable discharging under these conditions. After discharging was continued under these conditions for one minute, a lower barrier layer with a thickness of 100 Å was formed. Then, the high frequency power source 1443 was turned off for intermission of glow discharging. Subsequently, the outflow valve 1430 was closed and the main valve 1410 fully opened to discharge the gas in the deposition chamber 1401 until it was evacuated to $5\times10^{-6}$ Torr. Then, the input voltage at the heater 1408 was changed by elevating the input voltage while detecting the substrate temperature, until it was stabilized constantly at 200° C. Subsequently, following the same procedures as in Example 1, an amorphous layer was formed. Using the thus prepared image-forming member, image formation was effected on a transfer paper in the same manner and under the same conditions as in Example 1. As the result, there was obtained a very clear image.

EXAMPLE 7

An amorphous layer was formed on a molybdenum substrate according to the same procedure under the same conditions as in Example 4 except for replacing $C_2H_4(0.2)/Ar$ gas with $C_2H_4(0.2)/H_2$ gas.

In this case, the layer formed had a thickness of about 15 μ. When an image was formed on a transfer paper using this image-forming member according to the same procedure and under the same conditions as in Example 1, there was obtained a very clear image.

EXAMPLE 8

Each of Examples 1 to 7 was repeated in a similar manner and under similar conditions to that of each Example except that $CH_4$ was used in place of $C_2H_4$ in each Example. When corresponding electrophotographic image-forming process was applied to each resulting photoconductive member, a transferred image with very high quality was obtained. Further, even after repeated uses for a long time, there was no deterioration observed in quality of the transferred image.

EXAMPLE 9

Using a device as shown in FIG. 14 placed in a clean room which had been completely shielded, an image-forming member for electrophotography was prepared according to the following procedures.

A molybdenum plate (substrate) 1409 of 10 cm square having a thickness of 0.5 mm, whose surface had been cleaned, was fixed firmly on a supporting member 1403 disposed at a predetermined position in a glow discharge deposition chamber 1401. The substrate 1409 was heated by a heater 1408 within the supporting member 1403 with a precision of ±0.5° C. The temperature was measured directly at the backside of the substrate by an alumel-chromel thermocouple. Then, after confirming that all the valves in the system were closed, the main valve 1410 was opened, and evacuation of the chamber 1401 was effected to about $5\times10^{-6}$ Torr. Thereafter, the input voltage for the heater 1408 was elevated while detecting the substrate temperature until the temperature was stabilized constantly at 250° C.

Then, the auxiliary valve 1441, subsequently the outflow valves 1426, 1427, 1429 and the inflow valves 1421, 1422, 1424 were opened fully to effect degassing sufficiently in the mass flow controllers 1416, 1417, 1419 to vacuo. After closing the auxiliary valve 1441 and the valves 1426, 1427, 1429, 1421, 1422, 1424, the valve 1431 of the $SiH_4(10)/H_2$ gas bomb 1411 and the valve 1434 of the $C_2H_4$ gas (purity: 99.999%) bomb 1414 were respectively opened to adjust the pressures at the outlet pressure gages 1436 and 1439, respectively, at 1 kg/cm², whereupon the inflow valves 1421 and 1424 were gradually opened to permit $SiH_4(10)/H_2$ gas and $C_2H_4$ gas to flow into the mass flow controllers 1416 and 1419, respectively. Subsequently, the outflow valves 1426 and 1429 were gradually opened, followed by opening of the auxiliary valve 1441. The mass flow controllers 1416 and 1419 were adjusted thereby so that the gas feed ratio of $SiH_4(10)/H_2$ to $C_2H_4$ could be 10:1. Then, while carefully reading the Pirani gage 1442, the opening of the auxiliary valve 1441 was adjusted and opened to the extent until the inner pressure in the chamber 1401 became $1\times10^{-2}$ Torr.

After the inner pressure in the chamber 1401 was stabilized, the main valve 1410 was gradually closed to narrow its opening until the indication on the Pirani gage 1442 became 0.1 Torr. After confirming that the gas feeding and the inner pressure were stable, the switch of the high frequency power source 1443 was turned on with the shutter 1405 (which was also the electrodes) being closed to input a high frequency power of 13.56 MHz between the electrodes 1403 and 1405 to generate glow discharging in the chamber 1401 to provide an input power of 3 W.

The above conditions were maintained for 10 minutes to form a lower region layer constituting the amorphous layer to a thickness of 600 Å. Then, with the high frequency power source 1443 being turned off for intermission of glow discharge, the outflow valve 1429 was closed. By opening gradually the inflow valve 1422 and the outflow valve 1427, $C_2H_4 (0.1)/H_2$ gas was permitted to flow into the mass flow controller 1417 from the $C_2H_4(0.1)/H_2$ gas bomb 1412 through the valve 1432 at a gas pressure of 1 kg/cm² (reading on the outlet pressure gage 1437) and the feed gas ratio of $C_2H_4(0.1)/H_2$ gas to $SiH_4 (10)/H_2$ gas was controlled to 1:1 by controlling the mass flow controllers 1416 and 1417. Subsequently, the high frequency power source 1443 was turned on again to recommence glow discharge. The input power was 10 W.

The value of flow amount set for the mass flow controller 1417 was continuously decreased simultaneously with commencement of formation of a layer on the lower region layer over 3 hours so that the gas feed ratio of $SiH_4(10)/H_2$ gas to $C_2H_4$ (0.1)/$H_2$ gas could become 10:0.3 after 3 hours. After layer formation was thus conducted for 5 hours, the heater 1408 was turned off with the high frequency power source 1443 being also turned off, and the substrate was left to cool to 100° C., whereupon the outflow valves 1426, 1427 and the inflow valves 1421, 1422, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate having formed respective layers was taken out. In this case, the entire thickness of the layers was about 9 μ.

The thus prepared image-forming member was placed in an experimental device for charging and exposure to light, and corona charging was effected at ⊖ 5.5 KV for 0.2 sec., followed immediately by irradiation of a light image. The light image was irradiated through a transmission type test chart using a tungsten lamp as light source at a dosage of 1.0 lux. sec.

Immediately thereafter, positively ⊕ charged developers (containing toner and carrier) were cascaded on the surface of the image-forming member to obtain a good toner image on the image-forming member. When the toner image on the image-forming member was transferred on a transfer paper by corona charging at ⊖ 5.0 KV, there was obtained a clear image of high density which was excellent in resolution as well as gradation reproducibility.

EXAMPLE 10

A molybdenum substrate was set similarly as in Example 9, followed by evacuation of the glow discharge deposition chamber 1401 to $5 \times 10^{-5}$ Torr according to the same procedures as in Example 9. After the substrate temperature was maintained at 250° C., according to the same procedures as in Example 9, the auxiliary valve 1441, subsequently the outflow valves 1426, 1427, and inflow valves 1421, 1422 were fully opened thereby to effect sufficiently degassing of the mass flow controllers 1416, 1417 to vacuo. After closing of the auxiliary valve. 1441 and the valves 1426, 1427, 1421, 1422, the valve 1431 of the $SiH_4(10)/H_2$ gas bomb 1411 and the valve 1432 of the $C_2H_4(0.1)/H_2$ gas bomb 1412 were opened to adjust the pressures at the outlet pressure gages 1436 and 1437, respectively, at 1 kg/cm$^2$, whereupon the inflow valves 1421 and 1422 were gradually opened to permit $SiH_4(10)/H_2$ gas and $C_2H_4(0.1)/H_2$ gas to flow into the mass flow controllers 1416 and 1417, respectively. Subsequently, the outflow valves 1426 and 1427 were gradually opened, followed by gradual opening of the auxiliary valve 1441. The mass flow controllers 1416 and 1417 were adjusted thereby so that the gas feed ratio of $SiH_4(10)/H_2$ to $C_2H_4(0.1)/H_2$ could be 1:0.

Then, while carefully reading the Pirani gage 1442, the opening of the auxiliary valve 1441 was adjusted and opened to the extent until the inner pressure in the chamber 1401 became $1 \times 10^{-2}$ Torr. After the inner pressure in the chamber 1401 was stabilized, the main valve 1410 was gradually closed to narrow its opening until the indication on the Pirani gage 1442 became 0.1 Torr. After confirming that the gas feeding and the inner pressure were stable, followed by closing of the shutter 1405 (which was also the electrode), the switch of the high frequency power source 1443 was turned on to input a high frequency power of 13.56 MHz between the electrodes 1403 and 1405 to generate glow discharging in the chamber 1401 to provide an input power of 10 W. Under the above conditions, the value of flow amount set for the mass flow controller 1417 was continuously increased simultaneously with commencement of formation of the amorphous layer on the substrate over 5 hours so that the gas feed ratio of $SiH_4(10)/H_2$ gas to $C_2H_4(0.1)/H_2$ gas could become 10:0.3 after 5 hours.

After the amorphous layer was thus formed, the heater 1408 was turned off, with the high frequency power source 1443 being also turned off, the substrate was left to cool to 100° C., whereupon the outflow valves 1426, 1427 and the inflow valves 1421, 1422 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers was about 15 μ. Using the image-forming member, image was formed on a transfer paper according the same procedure and under the same conditions as in Example 9, whereby a very clear image was obtained.

EXAMPLE 11

After formation of a layer constituting a part of the amorphous layer in this Example on a molybdenum substrate according to the same procedures and under the same conditions as in Example 9, the high frequency power source 1443 was turned off for intermission of glow discharge. Under this state, the outflow valve 1427 was closed and then the outflow valve 1429 was opened again, and the feed ratio of $C_2H_4$ gas to $SiH_4(10)/H_2$ was stabilized to 1/10 by adjusting the mass flow controllers 1419 and 1416. Subsequently, the high frequency power source 1443 was turned on to recommence glow discharging. The input voltage was thereby adjusted to 3 W, similarly as before.

Under these conditions, glow discharge was further maintained for 15 minutes to form an upper region layer to a thickness of 900 Å, and thereafter the heater 1408 was turned off, with the high frequency power source 1443 being also turned off, the substrate was left to cool to 100° C., whereupon the outflow valves 1426, 1429 and the inflow valves 1421, 1422, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers formed was about 9 μ. Using this image-forming member, image was formed on a transfer paper under the same conditions and according to the same procedures as in Example 9, whereby there was obtained a very clear image.

EXAMPLE 12

After formation of a layer constituting a part of the amorphous layer in this Example on a molybdenum substrate according to the same procedures and under the same conditions as in Example 10, the high frequency power source 1443 was turned off for intermission of glow discharge. Under this state, the outflow valve 1427 was closed and then outflow valve 1429 was opened again, and the feed ratio of $C_2H_4$ gas to $SiH_4(10)/H_2$ was stabilized to 1/10 by adjusting the mass flow controllers 1419 and 1416. Subsequently, the high frequency power source 1443 was turned on to recommence glow discharging. The input voltage was thereby adjusted to 3 W, similarly as before.

Under these conditions, glow discharge was further maintained for 10 minutes to form an upper region layer to a thickness of 900 Å, and thereafter the heater 1408 was turned off, with the high frequency power source 1443 being also turned off, the substrate was left to cool to 100° C., whereupon the outflow valves 1426, 1429 and the inflow valves 1421, 1422, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers formed was about 15 µ. Using this image-forming member, image was formed on a transfer paper under the same conditions and according to the same procedures as in Example 9, whereby there was obtained a very clear image.

EXAMPLE 13

A molybdenum substrate was set similarly as in Example 9, followed by evacuation of the glow discharge deposition chamber 1401 to $5 \times 10^{-6}$ Torr according to the same procedures as in Example 9. After the substrate temperature was maintained at 250° C., according to the same procedures as in Example 9, the auxiliary valve 1441, subsequently the outflow valves 1426., 1427 and inflow valves 1421, 1422 were fully opened thereby to effect sufficiently degassing of the mass flow controllers 1416, 1417 to vacuo. After closing of the auxiliary valve 1441 and the valves 1426, 1427, 1421, 1422, the valve 1431 of $SiH_4(10)/H_2$ gas bomb 1411 and the valve 1432 of the $C_2H_4(0.1)/H_2$ gas bomb 1412 were opened to adjust the pressures at the outlet pressure gages 1436, 1437, respectively, to 1 kg/cm², followed by gradual opening of the inflow valves 1421, 1422 to permit the $SiH_4(10)/H_2$ gas and $C_2H_4(0.1)/H_2$ gas to flow into the mass flow controllers 1416 and 1417, respectively. Subsequently, the outflow valves 1426 and 1427 were gradually opened, followed by gradual opening of the auxiliary valve 1441. The inflow valves 1421 and 1422 were adjusted thereby so that the gas feed ratio of $SiH_4(10)/H_2$ to $C_2H_4(0.1)/H_2$ could be 1:10.

Then, while carefully reading the Pirani gage 1442, the opening of the auxiliary valve 1441 was adjusted and it was opened to the extent until the inner pressure in the chamber 1401 became $1 \times 10^{-2}$ Torr. After the inner pressure in the chamber 1401 was stabilized, the main valve 1410 was gradually closed to narrow its opening until the indication on the Pirani gage 1441 became 0.3 Torr. After confirming that the gas feeding and the inner pressure were stable, followed by closing of the shutter 1405 (which was also the electrode), the switch of the high frequency power source 1443 was turned on to input a high frequency power of 13.56 MHz between the electrodes 1403 and 1405 to generate glow discharging in the chamber 1401 to provide an input power of 10 W. Simultaneously with commencement of formation of a layer on the substrate under the above conditions, the setting value of flow amount at the mass flow controller 1417 was continuously decreased over 2.5 hours to control the gas feed ratio of $SiH_4(10)/H_2$ to $C_2H_4(0.1)/H_2$ after 2.5 hours from commencement of layer formation to 10:0.3. Then, after the same conditions had further been maintained for 30 minutes, the value of flow amount set at the mass flow controller 1417 was continuously increased, as contrary to the previous operation so that the gas feed ratio of $SiH_4(10)/H_2$ to $C_2H_4(0.1)/H_2$ could become 1:10 after 2.5 hours from commencement of increase of the flow amount.

After the amorphous layer was thus formed, the heater 1408 was turned off, with the high frequency power source 1443 being also turned off, and the substrate was left to cool to 100° C., whereupon the outflow valves 1426, 1427 and the inflow valves 1421, 1422 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers formed was about 17 µ. Using this image-forming member, image was formed on a transfer paper under the same conditions and according to the same procedures as in Example 9, whereby there was obtained a very clear image.

EXAMPLE 14

After formation of a lower region layer on a molybdenum substrate according to the same procedures and under the same conditions as in Example 9, the high frequency power source 1443 was turned off for intermission of glow discharge. Under this state, the outflow valve 1429 was closed and thereafter the valve 1432 of the $C_2H_4(0.1)/H_2$ gas bomb 1412, and the valve 1433 of the $B_2H_6(50)/H_2$ gas bomb 1413 were opened to adjust the pressures at the outlet pressure gauges 1437, 1438, respectively, to 1 kg/cm², followed by gradual opening of the inflow valves 1422, 1423 to permit the $C_2H_4(0.1)/H_2$ gas and $B_2H_6(50)/H_2$ gas to flow into the mass flow controllers 1417, 1418, respectively. Subsequently, the outflow valves 1427 and 1428 were gradually opened. The mass flow controllers 1416, 1417 and 1418 were adjusted thereby so that the gas feed ratio of $SiH_4(10)/H_2$ to $C_2H_4(0.1)/H_2$ was 1:10 and gas feed ratio of $SiH_4(10)/H_2$ to $B_2H_6(50)/H_2$ 50:1. Then, while carefully reading the Pirani gage 1442, the opening of the auxiliary valve 1441 was readjusted and it was opened to the extent until the inner pressure in the chamber 1401 became $1 \times 10^{-2}$ Torr. After the inner pressure in the chamber 1401 was stabilized, the main valve 1410 was also readjusted until the indication on the Pirani gage 1442 became 0.1 Torr.

After confirming that the gas feeding and the inner pressure were stable, the switch of the high frequency power source 1443 was turned on to input a high frequency power of 13.56 MHz to recommence glow discharging in the chamber 1401 to provide an input power of 10 W.

Simultaneously with commencement of formation of a layer under the above conditions, the setting value of flow amount at the mass flow controller 1417 was continuously decreased over 5 hours to control the gas feed ratio of $SiH_4(10)/H_2$ to $C_2H_4(0.1)/H_2$ after 5 hours from commencement of layer formation to 10:0.3. After layer formation was thus performed for 5 hours, the heater 1408 was turned off, with the high frequency power source 1443 being also turned off, the substrate was left to cool to 100° C., whereupon the outflow valves 1426, 1427, 1428 and the inflow valves 1421, 1422, 1423, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers formed was about 15 μ.

The thus prepared image-forming member was placed in an experimental device for charging and exposure to light, and corona charging was effected at $\ominus$ 5.5 KV for 0.2 sec., followed immediately by irradiation of a light image. The light image was irradiated through a transmission type test chart using a tungsten lamp as light source at a dosage of 1.0 lux. sec.

Immediately thereafter, positively $\oplus$ charged developers (containing toner and carrier) were cascaded on the surface of the image-forming member to obtain a good toner image on the image-forming member. When the toner image on the image-forming member was transferred on a transfer paper by corona charging at $\ominus$ 5.0 KV, there was obtained a clear image of high density which was excellent in resolution as well as gradation reproducibility.

Next, the above image-forming member was subjected to corona charging by means of a charging light-exposure experimental device at $\oplus$ 6.0 KV for 0.2 sec., followed immediately by image exposure to light at a dosage of 1.0 lux.sec., and immediately thereafter $\ominus$ charged developer was cascaded on the surface of the member. Then, by transferring on a transfer paper and fixing, there was obtained a very clear image.

As apparently seen from the above result, in combination with the previous result, the image-forming member for electrophotography obtained in this Example has the characteristics of a both-polarity image-forming member having no dependency on the charged polarity.

EXAMPLE 15

An amorphous layer was formed on a molybdenum substrate under the same operational conditions as described in Example 10 except for the following conditions. Namely, the $SiH_4(10)/H_2$ gas bomb 1411 was replaced with the $SiF_4$ gas (purity: 99.999%) bomb, and the $C_2H_4(0.1)/H_2$ gas bomb 1412 with the bomb of argon gas containing 0.2 vol. % of $C_2H_4$ [hereinafter abridged as $C_2H_4(0.2)/Ar$]. The feed gas ratio of $SiF_4$ gas to $C_2H_4(0.2)/Ar$ at the initial stage of deposition of the amorphous layer was set at 1:18, and said feed gas ratio was continuously decreased after commencement of the layer formation until it was 1:0.6 at the completion of deposition of the amorphous layer. Further, the input power for glow discharging was changed to 100 W. The layer thickness formed in this case was about 18 μ. The thus prepared image-forming member was tested for image formation on a transfer paper according to the same procedures as in Example 9, whereby a very clear image was obtained.

EXAMPLE 16

Using a device as shown in FIG. 14, an image-forming member for electrophotography was prepared according to the following procedures.

A molybdenum plate (substrate) 1409 of 10 cm square having a thickness of 0.5 mm, which surface had been cleaned, was fixed firmly on a supporting member 1403 disposed at a predetermined position in a deposition chamber 1401. The target 1404 was formed by mounting a high purity graphite (99.999%) on a high purity polycrystalline silicon (99.999%) with an area ratio of silicon to graphite being 1:9. The substrate 1409 was heated by a heater 1408 within the supporting member 1403 with a precision of ±0.5° C. The temperature was measured directly at the backside of the substrate by an alumel-chromel thermocouple. Then, after confirming that all the valves in the system were closed, the main valve 1410 was fully opened, and evacuation of the chamber 1401 was effected to about $5\times10^{-6}$ Torr (all the valves in the system were closed during this operation). Then, the auxiliary valve 1441 and the outflow valves 1426, 1427, 1429, 1430 were opened to effect degassing sufficiently in the mass flow controllers 1416, 1417, 1419, 1420 to vacuo. Thereafter, the outflow valves 1426, 1427, 1429, 1430 and the auxiliary valve 1441 were closed. The valve 1435 of the bomb 1415 containing argon gas (purity: 99.999%) was opened to adjust the pressure at the outlet pressure gauge 1440 at 1 kg/cm², whereupon the inflow valve 1425 was opened followed by gradual opening of the outflow valve 1430 to permit Ar gas to flow into the deposition chamber 1401. The outflow valve 1430 was gradually opened until the indication on the Pirani gauge 1411 became $5\times10^{-4}$ Torr. After the flow amount was stabilized under this state, the main valve 1410 was gradually closed to narrow the opening until the pressure in the chamber became $1\times10^{-2}$ Torr. With the shutter 1405 being opened, after confirming that the mass flow controller 1420 was stabilized, the high frequency power source 1443 was turned on to input an alternate current of 13.56 MHz, 100 W between the target 1404 and the supporting member 1403. A layer was formed while taking matching so as to continue stable discharging under these conditions. By continuation of discharging under these conditions for one minute, a lower barrier layer with a thickness of 100 Å was formed. Then, the high frequency power source 1443 was turned off for intermission of glow discharging. Subsequently, the outflow valve 1430 was closed and the main valve 1410 fully opened to discharge the gas in the deposition chamber 1401 until it was evacuated to $5\times10^{-6}$ Torr. Then, the input voltage at the heater 1408 was changed by elevating the input voltage while detecting the substrate temperature, until it was stabilized constantly at 200° C.

Subsequently, following the same procedures and under the same conditions as in Example 10, an amorphous layer was formed. Using the thus prepared image-forming member, image formation was effected on a transfer paper in the same manner and under the same conditions as in Example 9. As the result, there was obtained a very clear image.

EXAMPLE 17

An amorphous layer was formed on a molybdenum substrate according to the same procedure and under the same conditions as in Example 15 except for replacing $C_2H_4(0.2)/Ar$ gas bomb 1412 with $C_2H_4(0.2)/H_2$ gas bomb. In this case, the layer formed had a thickness of about 15 μ. When an image was formed on a transfer paper using this image-forming member according to the same procedure and under the same conditions as in Example 9, there was obtained a very clear image.

EXAMPLE 18

Examples 9 to 15 were similarly repeated except that $CH_4$ was used in place of $C_2H_4$ in each Example. When corresponding electrophotographic image forming process was applied to each prepared photoconductive member, a transferred image with very high quality was obtained. Further, even after repeated uses for a long time, there was no deterioration observed in quality of the transferred image.

EXAMPLE 19

Using a device as shown in FIG. 14 placed in a clean room which had been completely shielded, an image-forming member for electrophotography was prepared according to the following procedures.

A molybdenum plate (substrate) 1409 of 10 cm square having a thickness of 0.5 mm, whose surface had been cleaned, was fixed firmly on a supporting member 1403 disposed at a predetermined position in a glow discharge deposition chamber 1401. The substrate 1409 was heated by a heater 1408 within the supporting member 1403 with a precision of ±0.5° C. The temperature was measured directly at the backside of the substrate by an alumel-chromel thermocouple. Then, after confirming that all the valves in the system were closed, the main valve 1410 was opened, and evacuation of the chamber 1401 was effected to about $5 \times 10^{-6}$ Torr. Thereafter, the input voltage for the heater 1408 was elevated by varying the input voltage while detecting the substrate temperature until the temperature was stabilized constantly at 250° C.

Then, the auxiliary valve 1441, subsequently the outflow valves 1426, 1427, 1429 and the inflow valves 1421, 1422, 1424 were opened fully to effect degassing sufficiently in the mass flow controllers 1416, 1417, 1419 to vacuo. After closing the auxiliary valve 1441 and the valves 1426, 1427, 1429, 1421, 1424, the valve 1431 of the $SiH_4(10)/H_2$ gas bomb 1411 and the valve 1434 of the bomb 1414 containing $C_2H_4$ gas (purity: 99.999%) were respectively opened to adjust the pressures at the outlet pressure gauges 1436 and 1439, respectively, at 1 kg/cm$^2$, whereupon the inflow valves 1421 and 1424 were gradually opened to permit $SiH_4(10)/H_2$ gas and $C_2H_4$ gas to flow into the mass flow controllers 1416 and 1419, respectively. Subsequently, the outflow valves 1426 and 1429 were gradually opened, followed by gradual opening of the auxiliary valve 1441. The mass flow controllers 1416 and 1419 were adjusted thereby so that the gas feed ratio of $SiH_4(10)/H_2$ to $C_2H_4$ could be 10:1. Then, while carefully reading the Pirani gage 1442, the opening of the auxiliary valve 1441 was adjusted and opened to the extent until the inner pressure in the chamber 1401 became $1 \times 10^{-2}$ Torr.

After the inner pressure in the chamber 1401 was stabilized, the main valve 1410 was gradually closed to narrow its opening until the indication on the Pirani gauge 1442 became 0.1 Torr.

After confirming that the gas feeding and the inner pressure were stable, followed by turning on of the switch of the high frequency power source 1443 and closing of the shutter 1405 (which was also the electrode), a high frequency power of 13.56 MHz was applied between the electrodes 1403 and 1405 to generate glow discharging in the chamber 1401 to provide an input power of 3 W. The above conditions were maintained for 10 minutes to form a lower region layer constituting a part of the amorphous layer to a thickness of 600 Å.

Then, with the high frequency power source 1443 being turned off for intermission of the glow discharge, the outflow valve 1429 was closed. Thereafter, the $C_2H_4(0.1)/H_2$ gas was permitted to flow into the mass flow controller 1417 through the valve 1432 of the $C_2H_4(0.1)/H_2$ gas bomb 1412 under the pressure of 1 kg/cm$^2$ (reading on the outlet pressure gauge 1437) by gradual opening of the inflow valve 1422 and the outflow valve 1427, and the feed gas ratio of $C_2H_4(0.1)/H_2$ to $SiH_4(10)/H_2$ was controlled to 10:0.3 by controlling the mass flow controllers 1416 and 1417. Subsequently, the high frequency power source 1443 was turned on again to recommence glow discharge. The input power was 10 W.

After an intermediate region constituting a part of the amorphous layer was formed under the above conditions for 5 hours, the high frequency power source 1443 was turned off for intermission of glow discharge. Under this state, the outflow valve 1427 was closed, followed by reopening of the outflow valve 1429, and the flow amount of the $C_2H_4$ gas was stabilized to 1/10 relative to the flow amount of $SiH_4(10)/H_2$ gas by adjustment of the mass flow controllers 1419, 1416. Subsequently, the high frequency power source 1443 was turned on again to recommence glow discharge. The input power was 3 W, similarly as before.

After glow discharging was maintained for 15 minutes to form an upper region layer constituting a part of the amorphous layer to a thickness of 900 Å, the heater 1408 was turned off, with the high frequency power source 1443 being also turned off, the substrate was left to cool to 100° C., whereupon the outflow valves 1426, 1429 and the inflow valves 1421, 1422, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate having formed respective layers was taken out. In this case, the entire thickness of the layers was about 15 μ.

The thus prepared image-forming member was placed in an experimental device for charging and exposure to light, and corona charging was effected at ⊖ 5.5 KV for 0.2 sec., followed by irradiation of a light image. The light image was irradiated through a transmission type test chart using a tungsten lamp as light source at a dosage of 1.0 lux.sec.

Immediately thereafter, positively ⊕ charged developers (containing toner and carrier) were cascaded on the surface of the image-forming member to obtain a good toner image on the image-forming member. When the toner image on the image-forming member was transferred on a transfer paper by corona charging at ⊖ 5.0 KV there was obtained a clear image of high density which was excellent in resolution as well as gradation reproducibility.

EXAMPLE 20

A molybdenum substrate was set similarly as in Example 19, followed by evacuation of the glow discharge deposition chamber 1401 to $5 \times 10^{-5}$ Torr according to the same procedures as in Example 19. According to the same procedures as in Example 19, the auxiliary valve 1441, subsequently the outflow valves 1426, 1427, 1429, 1430 and inflow valves 1421, 1422, 1424, 1425 were fully opened thereby to effect sufficiently degassing of the mass flow controllers 1416, 1417, 1419, 1420 to vacuo. After closing of the auxiliary valve 1441 and the valves 1426, 1427, 1429, 1430, 1421, 1422, 1424, 1425, the valve 1435 of the Ar gas (purity 99.999%) bomb 1415 was opened and adjusted to 1 kg/cm$^2$ of the reading on the outlet pressure gauge 1442. Then, inflow valve 1425 was opened, followed by gradual opening of the outflow valve 1430 to permit Ar gas to flow into the deposition chamber 1401. The outflow valve 1430 was gradually opened until the indication on the Pirani gauge 1442 became $5 \times 10^{-4}$ Torr. After the flow amount was stabilized under this state, the main valve 1410 was gradually closed to narrow the opening until the pressure in the chamber became $1 \times 10^{-2}$ Torr. After confirming that the mass flow controller 1420 was stabilized, with the shutter 1405 being opened, and then the high frequency power source 1443 was turned on and an alternate current of 13.56 MHz, 100 W was input between the supporting member 1403 and the target 1404 on which a polycrystalline high purity silicon (purity: 99.999%) and a high purity graphite (purity: 99.999%) were placed. A layer was formed while taking matching so as to continue stable discharging under these conditions. After discharging was continued under these conditions for one minute, a lower barrier layer with a thickness of 100 Å was formed. Then, the high frequency power source 1443 was turned off for intermission of glow discharging. Subsequently, the outflow valve 1430 and the shutter 1405 were closed and the main valve 1410 fully opened to discharge the gas in the deposition chamber 1401 until it was evacuated to $5 \times 10^{-6}$ Torr. Then, the input voltage at the heater 1408 was changed by elevating the input voltage while detecting the substrate temperature, until it was stabilized constantly at 200° C. Subsequently, following the same procedures and under the same conditions as in Example 19, an amorphous layer was formed.

Using the thus prepared image-forming member, image formation was effected on a transfer paper in the same manner and under the same conditions as in Example 19. As the result, there was obtained a very clear image.

EXAMPLE 21

After formation of a lower region layer constituting a part of an amorphous layer on a molybdenum substrate according to the same procedures and under the same conditions as in Example 19, the high frequency power source 1443 was turned off for intermission of glow discharge. Under this state, the outflow valve 1429 was closed, and thereafter the valve 1432 of the $C_2H_4(0.1)/H_2$ gas bomb 1412 and the valve 1433 of the $B_2H_6(50)/H_2$ gas bomb 1413 were opened to adjust the pressures at the outlet pressure gauges 1437, 1438, respectively, to 1 kg/cm², followed by gradual opening of the inflow valves 1422, 1423 to permit the $C_2H_4(0.1)/H_2$ gas and $B_2H_6(50)/H_2$ gas to flow into the mass flow controllers 1417, 1418, respectively. Subsequently, the outflow valves 1427 and 1428 were gradually opened. The mass flow controllers 1416, 1417 and 1418 were adjusted thereby so that the gas feed ratio of $SiH_4(10)/H_2$ to $C_2H_4(0.1)/H_2$ could be 10:0.3 and gas feed ratio of $SiH_4(10)/H_2$ to $B_2H_6(50)/H_2$ 50:1. Then, while carefully reading the Pirani gauge 1442, the opening of the auxiliary valve 1441 was readjusted and it was opened to the extent until the inner pressure in the chamber 1401 became $1 \times 10^{-2}$ Torr. After the inner pressure in the chamber 1401 was stabilized, the main valve 1410 was readjusted to narrow its opening until the indication on the Pirani gauge 1441 became 0.1 Torr.

After confirming that the gas feeding and the inner pressure were stable, the switch of the high frequency power source 1443 was turned on to input a high frequency power of 13.56 MHz to recommence glow discharging in the chamber 1401 to provide an input power of 10 W. The above conditions were maintained for 5 hours to form an intermediate region layer constituting a part of the amorphous layer. Thereafter, with the high frequency power source 1443 turned off for intermission of the glow discharge, the outflow valves 1427 and 1428 were closed, and then the outflow valve 1429 was opened again and the ratio of the flow amount of $C_2H_4$ gas to $SiH_4(10)/H_2$ gas was stabilized to 1/10 by controlling of the mass flow controllers 1419, 1416. Subsequently, the high frequency power source 1443 was turned on again to recommence glow discharge. The input power was thereby 3 W, similarly as in formation of the lower region layer.

After glow discharge was continued for 15 minutes to form an upper region layer constituting a part of the amorphous layer to a thickness of 900 Å, the heater 1408 was turned off, with the high frequency power source 1443 being also turned off, the substrate was left to cool to 100° C., whereupon the outflow valves 1426, 1427, 1428 and the inflow valves 1421, 1422, 1423, 1424 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers formed was about 15 μ.

The thus prepared image-forming member was placed in an experimental device for charging and exposure to light, and corona charging was effected at ⊖ 5.5 KV for 0.2 sec., followed immediately by irradiation of a light image. The light image was irradiated through a transmission type test chart using a tungsten lamp as light source at a dosage of 1.0 lux. sec.

Immediately thereafter, positively ⊕ charged developers (containing toner and carrier) were cascaded on the surface of the image-forming member to obtain a good toner image on the image-forming member. When the toner image on the image-forming member was transferred on a transfer paper by corona charging at ⊖ 5.0 KV, there was obtained a clear image of high density which was excellent in resolution as well as gradation reproducibility.

Next, the above image-forming member was subjected to corona charging by means of a charging light-exposure experimental device at ⊕ 6.0 KV for 0.2 sec., followed immediately by image exposure to light at a dosage of 1.0 lux. sec., and immediately thereafter ⊖ charged developer was cascaded on the surface of the member. Then, by transferring on a transfer paper and fixing, there was obtained a very clear image.

As apparently seen from the above result, in combination with the previous result, the image-forming member for electrophotography obtained in this Example has the characteristics of a both-polarity image-forming member having no dependency on the charged polarity.

EXAMPLE 22

A lower barrier layer was formed on a molybdenum substrate under the same operational conditions as described in Example 20 except that the $SiH_4(10)/H_2$ gas bomb 1411 was previously replaced with the $SiF_4$ gas (purity: 99.999%) bomb.

Then, with the high frequency power source 1443 being turned off for intermission of glow discharge, the outflow valve 1430 and the shutter 1405 were closed. Subsequently, the main valve 1410 was fully opened, and evacuation of the chamber 1401 was effected to $5 \times 10^{-6}$ Torr. Thereafter, the input voltage for the heater 1408 was elevated by varying the input voltage while detecting the substrate temperature until the temperature was stabilized constantly at 200° C.

Then, with the shutter 1405 being closed, an amorphous layer was formed according to the same procedure under the same conditions as in Example 19, except that $SiF_4$ gas and $C_2H_4$ gas were employed at a feed ratio of 1:1 for formation of a lower region layer and an upper region layer, and $SiF_4$ gas and $C_2H_4(0.1)/H_2$ gas employed at a feed ratio of 2:1 for formation of an intermediate region layer and that the input power for glow discharge was charged to 100 W.

After completion of formation of the amorphous layer, with the heater 1408 being turned off, the outflow valves 1426, 1428 were closed and the shutter 1405 was opened again. On cooling of the substrate temperature to 80° C., an upper barrier layer was subsequently formed on the amorphous layer according to the same procedure and under the same conditions as in formation of the lower barrier layer.

After the lower barrier layer, the amorphous layer and the upper barrier layer were formed on a molybdenum substrate as described above, the high frequency power source 1443 was turned off, whereupon the outflow valve 1430 and the inflow valves 1421, 1422, 1425 were closed, with the main valve 1410 being fully opened, thereby to make the inner pressure in the chamber 1401 to less than $10^{-5}$ Torr. Then, the main valve 1410 was closed and the inner pressure in the chamber 1401 was made atmospheric through the leak valve 1406, and the substrate was taken out. In this case, the entire thickness of the layers formed was about 15 µ. Using the image-forming member, image was formed on a transfer paper according to the same procedure and under the same conditions as in Example 19, whereby a very clear image was obtained.

EXAMPLE 23

Examples 19 to 22 were similarly repeated except that $CH_4$ was used in place of $C_2H_4$ in each Example. When corresponding electrophotographic image forming process was applied for each prepared photoconductive member, a transferred image with very high quality was obtained. Further, even after repeated uses for a long time, there was no deterioration observed in quality of the transferred image.

What we claim is:

1. A process for producing a photoconductive member having a substrate and a layer on the surface of the substrate comprising an amorphous material comprising silicon atoms as a matrix and at least one of hydrogen atoms and halogen atoms and having photoconductivity, which comprises the steps of:

(a) providing the substrate in a deposition chamber;

(b) introducing into the deposition chamber at least a starting gas for incorporating carbon atoms and a starting gas for incorporating silicon atoms and generating a glow discharge in the deposition chamber to form on the substrate a lower layer region comprising carbon atoms in a distribution content of $C_1$;

(c) introducing into the deposition chamber a starting gas for incorporating silicon atoms without introduction of a starting gas for incorporating carbon atoms and generating a glow discharge in the deposition chamber to form on the lower layer region an intermediate layer region not including carbon atoms; and (d) introducing into the deposition chamber a starting gas for incorporating carbon atoms and a starting gas for incorporating silicon atoms and generating a glow discharge in the deposition chamber to form on the intermediate layer region an upper layer region comprising carbon atoms in a distribution content of $C_1$.

2. The process according to claim 1, further comprising the step of introducing into the deposition chamber a starting gas for incorporating at least one of nitrogen atoms and oxygen atoms and a starting gas for incorporating silicon atoms and generating a glow discharge in the deposition chamber between the steps (a) and (b).

3. The process according to claim 1, wherein the step (b) is conducted with a single starting gas containing both carbon atoms and silicon atoms.

4. The process according to claim 1, wherein the step (d) is conducted with a single starting gas containing carbon atoms and silicon atoms.

5. The process according to claim 1, wherein the steps (b) and (d) are each conducted with a single starting gas containing both carbon atoms and silicon atoms.

6. The process according to claim 1, further comprising introducing a gas for incorporating a substance for controlling the conductivity type in the step (b).

7. The process according to claim 1, further comprising introducing a gas for incorporating a substance for controlling the conductivity type in the step (d).

8. The process according to claim 1, further comprising introducing a gas for incorporating a substance for controlling the conductivity type in each of the steps (b) and (d).

9. The process according to claim 1, wherein the starting gas for incorporating carbon atoms comprises at least one starting gas selected from the group consisting of saturated hydrocarbons having 1 to 5 carbon atoms, ethylenic hydrocarbons having 2 to 5 carbon atoms and acetylenic hydrocarbons having 2 to 4 carbon atoms.

10. The process according to claim 6, wherein the starting gas for incorporating a substance for controlling the conductivity type comprises a starting gas comprising an element belonging to Group III or V of the Periodic Table.

11. The process according to claim 7, wherein the starting gas for incorporating a substance for controlling the conductivity type comprises a starting gas comprising an element belonging to Group III or V of the Periodic Table.

12. The process according to claim 8, wherein the starting gas for incorporating a substance for controlling the conductivity type comprises a starting gas comprising an element belonging to Group III or V of the Periodic Table.

13. The process according to claim 1, wherein the gas for incorporating silicon atoms comprises a silicon hydride or silicon halide.

14. The process according to claim 1, further comprising in each of the steps (b), (c) and (d) optionally introducing at least one gas selected from the group consisting of a gas containing hydrogen atoms, a gas containing halogen atoms, argon gas and helium gas into the deposition chamber.

15. The process according to claim 14, wherein the gas containing hydrogen atoms is hydrogen gas.

16. The process according to claim 14, wherein the gas containing halogen atoms is at least one gas selected from the group consisting of fluorine gas, chlorine gas, bromine gas, iodine gas, BrF, ClF, $ClF_3$, $BrF_3$, $BrF_5$, $IF_7$, $IF_5$, ICl and IBr.

17. The process according to claim 3, wherein the silicon hydride gas comprises at least one gas selected from the group consisting of $SiH_4$, $Si_2H_6$, $Si_3H_8$ and $Si_4H_{10}$.

18. The process according to claim 1, wherein the atmosphere in which the glow discharge is generated in the step (b) comprises oxygen atoms.

19. The process according to claim 1, wherein the atmosphere in which the glow discharge is generated in the step (d) comprises oxygen atoms.

20. A process for producing a photoconductive member having a substrate and a layer on the surface of the substrate comprising an amorphous material comprising silicon atoms as a matrix and at least one of hydrogen atoms and halogen atoms and having photoconductivity, which comprises the steps of:

(a) providing the substrate in a deposition chamber;

(b) introducing into the deposition chamber at least a starting gas for incorporating carbon atoms and a starting gas for incorporating silicon atoms and generating a glow discharge in the deposition chamber to form on the substrate a lower layer region comprising carbon atoms in a distribution content of $C_1$; and (c) introducing into the deposition chamber a starting gas for incorporating carbon atoms and a starting gas for incorporating silicon atoms and generating a glow discharge in the deposition chamber to form on the lower layer region an upper layer region comprising carbon atoms in a distribution content of $C_2$.

21. The process according to claim 20, further comprising the step of introducing into the deposition chamber a starting gas for incorporating at least one of nitrogen atoms and oxygen atoms and a starting gas for incorporating silicon atoms and generating a glow discharge in the deposition chamber between the steps (a) and (b).

22. The process according to claim 20, wherein the step (b) is conducted with a single starting gas containing both carbon atoms and silicon atoms.

23. The process according to claim 20, wherein the step (c) is conducted with a single starting gas containing carbon atoms and silicon atoms.

24. The process according to claim 20, wherein the steps (b) and (c) are each conducted with a single starting gas containing both carbon atoms and silicon atoms.

25. The process according to claim 20, further comprising introducing a gas for incorporating a substance for controlling the conductivity type in the step (b).

26. The process according to claim 20, further comprising introducing a gas for incorporating a substance for controlling the conductivity type in the step (c).

27. The process according to claim 20, further comprising introducing a gas for incorporating a substance for controlling the conductivity type in the steps (b) and (c).

28. The process according to claim 20, wherein the starting gas for incorporating carbon atoms comprises at least one starting gas selected from the group consisting of saturated hydrocarbons having 1 to 5 carbon atoms, ethylenic hydrocarbons having 2 to 5 carbon atoms and acetylenic hydrocarbons having 2 to 4 carbon atoms.

29. The process according to claim 20, wherein the starting gas for incorporating a substance for controlling the conductivity type comprises a starting gas comprising an element belonging to Group III or V of the Periodic Table.

30. The process according to claim 26, wherein the starting gas for incorporating a substance for controlling the conductivity type comprises a starting gas comprising an element belonging to Group III or V of the Periodic Table.

31. The process according to claim 27, wherein the starting gas for incorporating a substance for controlling the conductivity type comprises a starting gas comprising an element belonging to Group III or V of the Periodic Table.

32. The process according to claim 20, wherein the gas for incorporating silicon atoms comprises a silicon hydride or silicon halide.

33. The process according to claim 20, further comprising in each of the steps (b) and (c) optionally introducing at least one gas selected from the group consisting of a gas containing hydrogen atoms, a gas containing halogen atoms, argon gas and helium gas into the deposition chamber.

34. The process according to claim 33, wherein the gas containing hydrogen atoms is hydrogen gas.

35. The process according to claim 33, wherein the gas containing halogen atoms is at least one gas selected from the group consisting of fluorine gas, chlorine gas, bromine gas, iodine gas, BrF, ClF, $ClF_3$, $BrF_3$, $BrF_5$, $IF_7$, $IF_5$, ICl and IBr.

36. The process according to claim 32, wherein the silicon hydride gas comprises at least one gas selected from the group consisting of $SiH_4$, $Si_2H_6$, $Si_3H_8$ and $Si_4H_{10}$.

37. The process according to claim 20, wherein the atmosphere in which the glow discharge is generated in the step (b) comprises oxygen atoms.

38. The process according to claim 20, wherein the atmosphere in which the glow discharge is generated in the step (c) comprises oxygen atoms.

* * * * *

UNITED STATES PATENT AND TRADEMARK OFFICE
CERTIFICATE OF CORRECTION

PATENT NO. : 5,582,947

DATED : December 10, 1996

INVENTORS : SHIGERU SHIRAI ET AL.

It is certified that error appears in the above-identified patent and that said Letters Patent is hereby corrected as shown below:

COLUMN 1

Line 52, "attracts" should read --attracted--.

COLUMN 2

Line 9, "uses" should read --use--;
Line 17, "Namely.," should read --Namely,--;
Line 32, "image/quality" should read --image quality--;
Line 49, "characteristics-superior" should read --characteristics superior--;
Line 64, "uses" should read --use--.

COLUMN 4

Line 9, "uses," should read --use,--;
Line 39, "Continuous" should read --continuous--.

COLUMN 6

Line 4, "like" should read --like.--.

UNITED STATES PATENT AND TRADEMARK OFFICE
CERTIFICATE OF CORRECTION

PATENT NO. : 5,582,947

DATED : December 10, 1996

INVENTORS : SHIGERU SHIRAI ET AL.

It is certified that error appears in the above-identified patent and that said Letters Patent is hereby corrected as shown below:

COLUMN 7

Line 21,   "$SiH_4$-$NH_3$-No" should read --$SiH_4$-$NH_3$-NO--.

COLUMN 8

Line 32,   "so called" should read --so-called--;
   Line 45,   "related" should read --selected--.

COLUMN 11

Line 22,   "or" should read --for--;
   Line 44,   "doner" should read --donor--.

COLUMN 12

Line 1,    "ordinate" should read --ordinates--;
   Line 7,    "in" should read --on--;
   Line 8,    "abscissa" should read --abscissas--;
   Line 52,   "was" should read --were--.

COLUMN 14

Line 65,   "while" should read --with--.

UNITED STATES PATENT AND TRADEMARK OFFICE
CERTIFICATE OF CORRECTION

PATENT NO. : 5,582,947

DATED : December 10, 1996

INVENTORS : SHIGERU SHIRAI ET AL.

It is certified that error appears in the above-identified patent and that said Letters Patent is hereby corrected as shown below:

COLUMN 17

Line 66, ".atmosphere" should read --atmosphere--.

COLUMN 18

Line 31, "like are" should read --like, is--;
   Line 41, "the amorphous layer of" (2nd occur.) should be deleted.

COLUMN 19

Line 46, "target-of" should read --target of--.

COLUMN 21

Line 54, "5x10$^{<6}$" should read --5x10$^{-6}$--;
   Line 59, "1441," should read --1441 and--.

COLUMN 22

Line 5, "them ass" should read --the mass--;
   Line 13, "until" should read --that--;

UNITED STATES PATENT AND TRADEMARK OFFICE
CERTIFICATE OF CORRECTION

PATENT NO. : 5,582,947
DATED : December 10, 1996
INVENTORS : SHIGERU SHIRAI ET AL.

It is certified that error appears in the above-identified patent and that said Letters Patent is hereby corrected as shown below:

COLUMN 22 continued

Line 46, "to" should be deleted.

COLUMN 23

Line 7, "1441," should read --1441 and--;
  Line 9, "1424," should read --1424--;
  Line 26, "until" should read --that--;
  Line 34, "input, and" should read --input--;
  Line 65, "to" should be deleted.

COLUMN 24

Line 16, "1441," should read --1441 and--;
  Line 31, "Sill$_4$" should read --SiH$_4$--;
  Line 34, "valves" should read --valve--;
  Line 35, "until" should read --that--;
  Line 61, "to" should be deleted.

COLUMN 25

Line 16, "ration" should read --ratio--;
  Line 32, "1441," should read- 1441 and--;

UNITED STATES PATENT AND TRADEMARK OFFICE
CERTIFICATE OF CORRECTION

PATENT NO. : 5,582,947

DATED : December 10, 1996

INVENTORS : SHIGERU SHIRAI ET AL.

It is certified that error appears in the above-identified patent and that said Letters Patent is hereby corrected as shown below:

<u>COLUMN 25</u> continued

Line 57,   "until" should read --that--.

<u>COLUMN 26</u>

Line 18,   "the" should read --and the--;
   Line 23,   "to" should be deleted.

<u>COLUMN 27</u>

Line 10,   "1441," should read --1441 and--;
   Line 27,   "and then" should be deleted.

<u>COLUMN 28</u>

Line 2,    "uses" should read --use--;
   Line 25,   "1441," should read --1441 and--;
   Line 43,   "until" should read --that--.

<u>COLUMN 29</u>

Line 15,   "to" should be deleted;
   Line 44,   "1441," should read --1441 and--;

UNITED STATES PATENT AND TRADEMARK OFFICE
CERTIFICATE OF CORRECTION

PATENT NO. : 5,582,947

DATED : December 10, 1996

INVENTORS : SHIGERU SHIRAI ET AL.

It is certified that error appears in the above-identified patent and that said Letters Patent is hereby corrected as shown below:

COLUMN 29 continued

Line 45,   "1427," should read --1427--;
   Line 48,   "valve." should read --valve--;
   Line 60,   "1:0" should read --1:10--;
   Line 63,   "until" should read --that--.

COLUMN 30

Line 16,   "the" should read --and the--;
   Line 20,   "to" should be deleted;
   Line 26,   "according" should read --according to--;
   Line 47,   "the" should read --and the--;
   Line 51,   "to" should be deleted.

COLUMN 31

Line 12,   "the" should read --and the--;
   Line 16,   "to" should be deleted;
   Line 32,   "1441," should read --1441 and--;
   Line 52,   "until" should read --that--.

COLUMN 32

Line 14,   "to" should be deleted;
   Line 44,   "until" should read --that--;
   Line 63,   "the" should read --and the--;

UNITED STATES PATENT AND TRADEMARK OFFICE
CERTIFICATE OF CORRECTION

PATENT NO. : 5,582,947

DATED : December 10, 1996

INVENTORS : SHIGERU SHIRAI ET AL.

It is certified that error appears in the above-identified patent and that said Letters Patent is hereby corrected as shown below:

COLUMN 32 continued

Line 67,   "to" should be deleted.

COLUMN 34

Line 66,   "uses" should read --use--.

COLUMN 35

Line 21,   "1441," should read --1441 and--;
   Line 40,   "until" should read --that--.

COLUMN 36

Line 2,    "was." should read --was--;
   Line 18,   "the" should read --and the--;
   Line 22,   "to" should be deleted;
   Line 51,   "1441," should read --1441 and--;
   Line 53,   "opened" should read --opened,--.

COLUMN 37

Line 2,    "and then" should be deleted;
   Line 47,   "until" should read --that--.

UNITED STATES PATENT AND TRADEMARK OFFICE
CERTIFICATE OF CORRECTION

PATENT NO. : 5,582,947

DATED : December 10, 1996

INVENTORS : SHIGERU SHIRAI ET AL.

It is certified that error appears in the above-identified patent and that said Letters Patent is hereby corrected as shown below:

<u>COLUMN 38</u>

Line 7, "the" should read --and the--;
  Line 11, "to" should be deleted.

<u>COLUMN 39</u>

Line 12, "the" should read --and the--;
  Line 16, "to" should be deleted.

Signed and Sealed this

Twenty-fourth Day of June, 1997

Attest:

BRUCE LEHMAN

*Attesting Officer*     *Commissioner of Patents and Trademarks*